(12) United States Patent
He et al.

(10) Patent No.: US 12,719,504 B2
(45) Date of Patent: Aug. 25, 2026

(54) ENCODING METHOD, DECODING METHOD, APPARATUS, DEVICE, SYSTEM, AND READABLE STORAGE MEDIUM

(71) Applicant: HUAWEI TECHNOLOGIES CO., LTD., Shenzhen (CN)

(72) Inventors: Xiang He, Beijing (CN); Xinyuan Wang, Beijing (CN); Hao Ren, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 145 days.

(21) Appl. No.: 18/761,707

(22) Filed: Jul. 2, 2024

(65) Prior Publication Data

US 2024/0356563 A1 Oct. 24, 2024

Related U.S. Application Data

(63) Continuation of application No. PCT/CN2022/142359, filed on Dec. 27, 2022.

(30) Foreign Application Priority Data

Jan. 5, 2022 (CN) ......................... 202210007010.2
Jan. 30, 2022 (CN) ......................... 202210114845.8

(51) Int. Cl.
*H03M 7/30* (2006.01)

(52) U.S. Cl.
CPC ....... *H03M 7/6011* (2013.01); *H03M 7/6005* (2013.01)

(58) Field of Classification Search
CPC ............. H03M 7/6011; H03M 7/6005; H03M 13/1575; H03M 7/70; H03M 7/6041
(Continued)

(56) References Cited

U.S. PATENT DOCUMENTS 7,382,878 B2 * 6/2008 Volpert, Jr. ............. H04L 9/065
380/37
2013/0346823 A1 12/2013 Cideciyan
(Continued)

FOREIGN PATENT DOCUMENTS

CN 101610134 A 12/2009
CN 113645524 A 11/2021
EP 4447347 A1 10/2024

OTHER PUBLICATIONS

Chris DiMinico et al. IEEE 802.3bj:"100GBASE-CR4 Specifications Minneapolis",MN May 2012, total 24 pages.
(Continued)

*Primary Examiner* — Peguy Jean Pierre
(74) *Attorney, Agent, or Firm* — WOMBLE BOND DICKINSON (US) LLP

(57) ABSTRACT

This application discloses an encoding method, a decoding method, an apparatus, a device, a system, and a readable storage medium. The encoding method includes: obtaining $2^n$ groups of code stream blocks including control blocks and data blocks; and performing first encoding on the $2^n$ groups of code stream blocks to obtain a target code block, where the target code block includes a data unit and a type that is determined based on the control blocks in the $2^n$ groups of code stream blocks, and the data unit is obtained by performing the first encoding on the data blocks included in the $2^n$ groups of code stream blocks in an encoding manner determined based on the control blocks and the data blocks in the $2^n$ groups of code stream blocks.

20 Claims, 10 Drawing Sheets

201: Obtain $2^n$ groups of code stream blocks, where any group of code stream blocks includes a control block and a data block, and n is an integer greater than 1

202: Perform first encoding on the $2^n$ groups of code stream blocks to obtain a target code block, where the target code block includes a data unit and a type that is determined based on control blocks in the $2^n$ groups of code stream blocks, and the data unit is obtained by performing the first encoding on data blocks in the $2^n$ groups of code stream blocks in an encoding manner determined based on the control blocks and the data blocks in the $2^n$ groups of code stream blocks

(58) Field of Classification Search
USPC ........................................................ 341/50, 51
See application file for complete search history.

(56) References Cited

U.S. PATENT DOCUMENTS

2016/0182084 A1* 6/2016 Yang ....................... H03M 7/30
341/87
2018/0159785 A1 6/2018 Wu et al.
2023/0396360 A1* 12/2023 Zhang ................. H04L 25/4908

OTHER PUBLICATIONS

John D'Ambrosia et al. IEEE P802.3bs:"Baseline Summary",IEEE P802.3bs 400 GbE Task Force, Jul. 18, 2015, total 183 pages.
Hidehiro Toyoda et al:"A 100-GB-ethernet subsystem for next-generation metro-area network",vol. 2, May 16, 2005 (May 16, 2005), pp. 1036-1042, XP010825445.

* cited by examiner

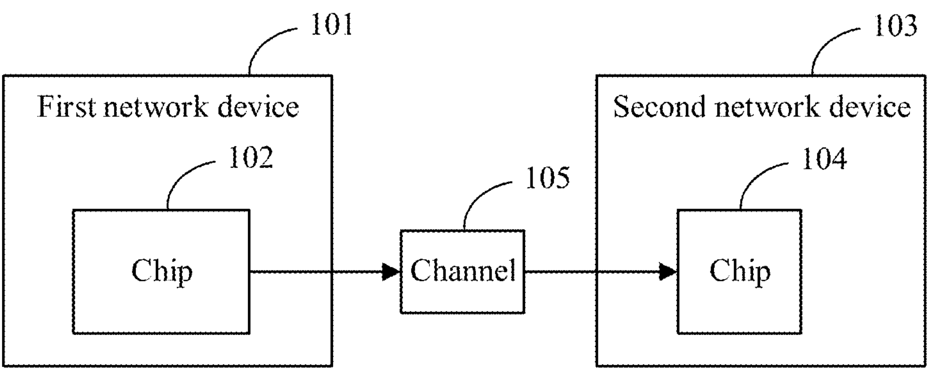

Obtain $2^n$ groups of code stream blocks, where any group of code stream blocks includes a control block and a data block, and n is an integer greater than 1

202

Perform first encoding on the $2^n$ groups of code stream blocks to obtain a target code block, where the target code block includes a data unit and a type that is determined based on control blocks in the $2^n$ groups of code stream blocks, and the data unit is obtained by performing the first encoding on data blocks in the $2^n$ groups of code stream blocks in an encoding manner determined based on the control blocks and the data blocks in the $2^n$ groups of code stream blocks

FIG. 2

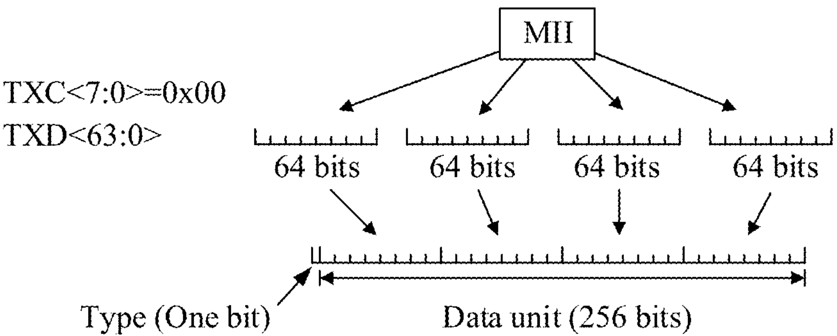

FIG. 3

| Type | Data unit | | | |
|---|---|---|---|---|
| 1 | D0 | D1 | D2 | D3 |

FIG. 4

| | | | | |
|---|---|---|---|---|
| Case 1 | E | D/C0 | D/C0 | D/C0 |
| Case 2 | D/C0 | E | D/C0 | D/C0 |
| Case 3 | D/C0 | D/C0 | E | D/C0 |
| Case 4 | D/C0 | D/C0 | D/C0 | E |
| Case 5 | E | E | D/C0 | D/C0 |
| Case 6 | E | D/C0 | E | D/C0 |
| Case 7 | E | D/C0 | D/C0 | E |
| Case 8 | D/C0 | E | E | D/C0 |
| Case 9 | D/C0 | E | D/C0 | E |
| Case 10 | D/C0 | D/C0 | E | E |
| Case 11 | E | E | E | D/C0 |
| Case 12 | E | E | D/C0 | E |
| Case 13 | E | D/C0 | E | E |
| Case 14 | D/C0 | E | E | E |
| Case 15 | E | E | E | E |

FIG. 8

| | | | | |
|---|---|---|---|---|
| Case 1 | S | D | D | D |
| Case 2 | C1 | S | D | D |
| Case 3 | C1 | C1 | S | D |
| Case 4 | C1 | C1 | C1 | S |

FIG. 9

| | | | | |
|---|---|---|---|---|
| Case 1 | T | C2 | C2 | C2 |
| Case 2 | D | T | C2 | C2 |
| Case 3 | D | D | T | C2 |
| Case 4 | D | D | D | T |

FIG. 10

| i= | 64 bits (8 bytes) | | | | | | | |
|---|---|---|---|---|---|---|---|---|
| 0 | /T/ | Padding bits+/C3/ | | | | | | |
| 1 | /D/ | /T/ | Padding bits+/C3/ | | | | | |
| 2 | /D/ | /D/ | /T/ | Padding bits+/C3/ | | | | |
| 3 | /D/ | /D/ | /D/ | /T/ | Padding bits+/C3/ | | | |
| 4 | /D/ | /D/ | /D/ | /D/ | /T/ | Padding bits+/C3/ | | |
| 5 | /D/ | /D/ | /D/ | /D/ | /D/ | /T/ | Padding bits+/C3/ | |
| 6 | /D/ | /D/ | /D/ | /D/ | /D/ | /D/ | /T/ | Padding bits+/C3/ |
| 7 | /D/ | /D/ | /D/ | /D/ | /D/ | /D/ | /D/ | /T/ |

FIG. 11

| | | | | |
|---|---|---|---|---|
| Case 1 | O | C4 | C4 | C4 |
| Case 2 | C4 | O | C4 | C4 |
| Case 3 | C4 | C4 | O | C4 |
| Case 4 | C4 | C4 | C4 | O |
| Case 5 | O | O | C4 | C4 |
| Case 6 | O | C4 | O | C4 |
| Case 7 | O | C4 | C4 | O |
| Case 8 | C4 | O | O | C4 |
| Case 9 | C4 | O | C4 | O |
| Case 10 | C4 | C4 | O | O |
| Case 11 | O | O | O | C4 |
| Case 12 | O | O | C4 | O |
| Case 13 | O | C4 | O | O |
| Case 14 | C4 | O | O | O |
| Case 15 | O | O | O | O |

FIG. 12

| | | | | |
|---|---|---|---|---|
| Case 1 | O | S | D | D |
| Case 2 | O | C5 | S | D |
| Case 3 | C5 | O | S | D |
| Case 4 | O | O | S | D |
| Case 5 | O | C5 | C5 | S |
| Case 6 | C5 | O | C5 | S |
| Case 7 | C5 | C5 | O | S |
| Case 8 | O | O | C5 | S |
| Case 9 | O | C5 | O | S |
| Case 10 | C5 | O | O | S |
| Case 11 | O | O | O | S |

FIG. 13

| | | | | |
|---|---|---|---|---|
| Case 1 | T | O | C6 | C6 |
| Case 2 | T | C6 | O | C6 |
| Case 3 | T | C6 | C6 | O |
| Case 4 | T | O | O | C6 |
| Case 5 | T | O | C6 | O |
| Case 6 | T | C6 | O | O |
| Case 7 | T | O | O | O |
| Case 8 | D | T | O | C6 |
| Case 9 | D | T | C6 | O |
| Case 10 | D | T | O | O |
| Case 11 | D | D | T | O |

FIG. 14

| | | | | |
|---|---|---|---|---|
| Case 1 | T | S | D | D |
| Case 2 | T | C7 | S | D |
| Case 3 | T | C7 | C7 | S |
| Case 4 | D | T | S | D |
| Case 5 | D | T | C7 | S |
| Case 6 | D | D | T | S |
| Case 7 | S | D | D | T |

FIG. 15

| | | | | |
|---|---|---|---|---|
| Case 1 | T | O | S | D |
| Case 2 | T | O | C8 | S |
| Case 3 | T | C8 | O | S |
| Case 4 | T | O | O | S |
| Case 5 | D | T | O | S |

| | 0 | 1 | 2 | 3 |
|---|---|---|---|---|
| Combination 0 | C | C | C | C |
| Combination 1 | C | C | C | D |
| Combination 2 | C | C | D | C |
| Combination 3 | C | C | D | D |
| Combination 4 | C | D | C | C |
| Combination 5 | C | D | C | D |
| Combination 6 | C | D | D | C |
| Combination 7 | C | D | D | D |
| Combination 8 | D | C | C | C |
| Combination 9 | D | C | C | D |
| Combination 10 | D | C | D | C |
| Combination 11 | D | C | D | D |
| Combination 12 | D | D | C | C |
| Combination 13 | D | D | C | D |
| Combination 14 | D | D | D | C |
| Combination 15 | D | D | D | D |

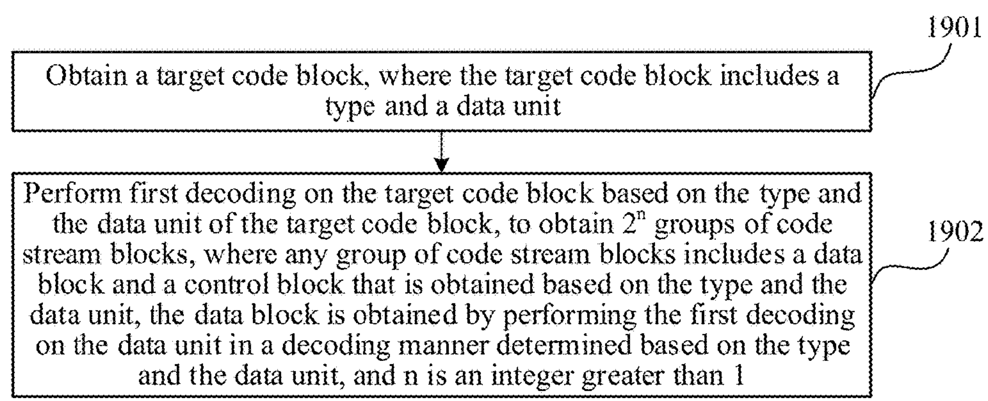
FIG. 19
| Type | Code block ID | | | | Code block content | | | | |
| --- | --- | --- | --- | --- | --- | --- | --- | --- | --- |
| 1b | 1b | 1b | 1b | 1b | 4b | 8b | 8b | ... | 8b |
| 0 | 1 | 1 | 1 | 1 | 0xE | 0x1E | 0x1E | ... | 0x1E |
FIG. 20
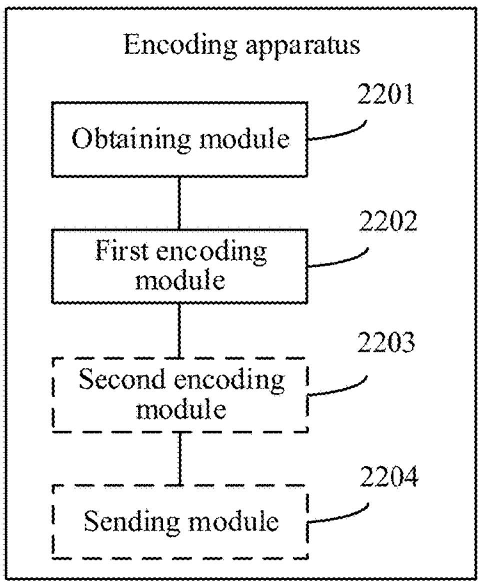
FIG. 21

ENCODING METHOD, DECODING METHOD, APPARATUS, DEVICE, SYSTEM, AND READABLE STORAGE MEDIUM

CROSS-REFERENCE TO RELATED APPLICATIONS

This application is a continuation of International Application No. PCT/CN2022/142359 filed on Dec. 27, 2022, which claims priority to Chinese Patent Application No. 202210007010.2, filed on Jan. 5, 2022, and Chinese Patent Application No. 202210114845.8, filed on Jan. 30, 2022. All of the aforementioned patent applications are hereby incorporated by reference in their entireties.

TECHNICAL FIELD

This application relates to the field of communication technologies, and in particular, to an encoding method, a decoding method, an apparatus, a device, a system, and a readable storage medium.

BACKGROUND

With development of communication technologies, data processing manners in data transmission processes are increasingly diversified. For example, a packet of a media access control (MAC) layer is delivered to a physical coding sublayer (PCS) through a media independent interface (MII). For example, the packet is delivered to the PCS through an 800 gigabit (G) MII, where the 800G MII represents an MII operating at a MAC rate of 800 gigabits per second (Gb/s). A data bit width of the MII is 72 bits, including an 8-bit control block (TXC) and a 64-bit data block (TXD). The TXC and the TXD are obtained by processing, through a reconciliation sublayer (RS), packet flow content from the MAC layer. The PCS performs encoding based on content of the TXC/TXD, to reduce overheads and provide necessary synchronization and protection functions.

In a related technology, a PCS at a transmit end performs 64-bit (B)/66B encoding on a control block and a data block from an MII, to obtain a 66-bit code block. When data transmission is performed by using a high-speed physical link, every four 66-bit code blocks are transcoded into one 256B/257B encoded block whose length is 257 bits, and forward error correction (FEC) encoding is performed on the 257-bit code block for transmission of FEC codewords obtained through the FEC encoding. After receiving the FEC codewords, a receive end performs FEC decoding on the FEC codewords, to obtain the 257-bit code block. In an FEC decoding process, error correction is performed on the FEC codewords, and for an uncorrectable FEC codeword, error bits in the FEC codeword are identified. Each 257-bit code block is reversely transcoded into four 66-bit 64B/66B encoded blocks, and the four 66-bit code blocks are decoded, to obtain a control block and a data block that are in an MII format.

Because the FEC encoding can provide a data protection function, and most processing at the PCS is performed based on the 257-bit code block, 64B/66B encoding and decoding processes are not necessary. If the 64B/66B encoding and decoding processes are retained, a subsequent transcoding/reverse transcoding process will cause unnecessary delay, power consumption, and chip area occupation.

SUMMARY

This application provides an encoding method, a decoding method, an apparatus, a device, a system, and a readable storage medium, to improve encoding efficiency and decoding efficiency.

According to a first aspect, an encoding method is provided. The method includes: obtaining $2^n$ groups of code stream blocks, where any group of code stream blocks includes a control block and a data block, and n is an integer greater than 1; and performing first encoding on the $2^n$ groups of code stream blocks to obtain a target code block, where the target code block includes a data unit and a type that is determined based on control blocks in the $2^n$ groups of code stream blocks, and the data unit is obtained by performing the first encoding on data blocks in the $2^n$ groups of code stream blocks in an encoding manner determined based on the control blocks and the data blocks in the $2^n$ groups of code stream blocks.

According to the encoding method provided in this application, the target code block is obtained by performing the first encoding on the $2^n$ groups of code stream blocks including the control blocks and the data blocks, without a need of performing 64B/66B encoding on each group of the $2^n$ groups of code stream blocks to obtain $2^n$ 66-bit code blocks and transcoding the $2^n$ 66-bit code blocks. Therefore, encoding efficiency is improved, and delay, power consumption, and chip area occupation caused by the encoding process are reduced.

In an embodiment, the type indicates that the target code block is a data code block; and the data unit is obtained by performing the first encoding on the data blocks in the $2^n$ groups of code stream blocks based on a sequence of the $2^n$ groups of code stream blocks.

In an embodiment, the type indicates that the target code block is a control code block; and the data unit includes a code block identifier ID and code block content, where the code block content is obtained by performing the first encoding on the data blocks in the $2^n$ groups of code stream blocks based on a sequence determined based on the control blocks and the data blocks in the $2^n$ groups of code stream blocks, the code block ID is obtained based on the control blocks and the data blocks in the $2^n$ groups of code stream blocks, and the code block ID indicates a type of a data block in each group of code stream blocks and a location, in the code block content, of first-encoded content of each group of code stream blocks.

In an embodiment, the code block ID includes a first ID and a second ID, the first ID indicates the type of the data block in each group of code stream blocks, and the second ID indicates the location, in the code block content, of the first-encoded content of each group of code stream blocks.

In an embodiment, the code block ID includes m bits, and m is an integer greater than or equal to 4.

In an embodiment, the code block ID has Hamming distance protection.

In an embodiment, the target code block is an error code block, and the error code block includes error indication data.

According to the encoding method provided in this application, the first encoding can be performed on different types of code stream blocks to obtain the target code block. Therefore, the method is widely applied.

In an embodiment, the target code block is obtained by processing the $2^n$ groups of code stream blocks based on an error detection result, and the error detection result is obtained based on the control blocks and the data blocks in the $2^n$ groups of code stream blocks. A code stream block in which an error occurs is processed, so that data in which an error occurs can be distinguished from correct data in subsequent data transmission, to ensure data reliability.

In an embodiment, the error detection result includes a content sequence error or content error of the $2^n$ groups of code stream blocks, the target code block is obtained by performing the first encoding based on a code stream block that has a correct content sequence and correct content and an error block in the $2^n$ groups of code stream blocks, and the error block is obtained based on a code stream block that has a content sequence error or content error in the $2^n$ groups of code stream blocks.

In an embodiment, the control block includes t bits, the data block includes 8t bits, and t is a positive integer.

In an embodiment, a value of n is 2, a value of t is 8, and the target code block is 257 bits.

In an embodiment, all of the $2^n$ groups of code stream blocks are from a media independent interface MII.

In an embodiment, after obtaining the target code block, the method further includes: performing second encoding on the target code block based on an FEC code type, to obtain first data; and sending the first data. The second encoding is performed on the target code block based on the FEC code type to obtain the first data, so that a receive end can perform error correction on the received first data, to ensure data transmission accuracy.

According to a second aspect, a decoding method is provided. The method includes: obtaining a target code block, where the target code block includes a type and a data unit; and performing first decoding on the target code block based on the type and the data unit of the target code block, to obtain $2^n$ groups of code stream blocks, where any group of code stream blocks includes a data block and a control block that is obtained based on the type and the data unit, the data block is obtained by performing the first decoding on the data unit in a decoding manner determined based on the type and the data unit, and n is an integer greater than 1.

According to the decoding method provided in this application, the $2^n$ groups of code stream blocks including the control blocks and the data blocks are obtained by performing the first decoding on the target code block, without a need of transcoding the target code block to obtain $2^n$ 66-bit code blocks and decoding the $2^n$ 66-bit code blocks. Therefore, decoding efficiency is improved, and delay, power consumption, and chip area occupation caused by the decoding process are reduced.

In an embodiment, the type indicates that the target code block is a data code block; and a data block included in group i of code stream blocks in the $2^n$ groups of code stream blocks is obtained by performing the first decoding on content, in the data unit, that corresponds to group i of code stream blocks and that has a length of 8t, where t is a positive integer, and i is an integer greater than or equal to 1 and less than or equal to $2^n$, or i is an integer greater than or equal to 0 and less than or equal to $2^n$-1.

In an embodiment, the type indicates that the target code block is a control code block, the data unit includes a code block identifier ID and code block content, and the code block ID indicates a type of a data block in each group of code stream blocks and a location, in the code block content, of first-encoded content of each group of code stream blocks; and a control block included in group i of code stream blocks in the $2^n$ groups of code stream blocks is obtained based on the type and the code block ID, and a data block included in group i of code stream blocks in the $2^n$ groups of code stream blocks is obtained by performing the first decoding on the code block content in a decoding manner determined based on the type and the code block ID, where i is an integer greater than or equal to 1 and less than or equal to $2^n$, or i is an integer greater than or equal to 0 and less than or equal to $2^n$-1.

In an embodiment, the code block ID includes a first ID and a second ID, the first ID indicates the type of the data block in each group of code stream blocks, and the second ID indicates the location, in the code block content, of the first-encoded content of each group of code stream blocks; and the control block included in group i of code stream blocks is obtained based on the type, bits that are in the first ID and that correspond to group i of code stream blocks, and bits that are in the second ID and that correspond to group i of code stream blocks; and the data block included in group i of code stream blocks is obtained by performing the first decoding on the code block content in a decoding manner determined based on the type, the bits that are in the first ID and that correspond to group i of code stream blocks, and the bits that are in the second ID and that correspond to group i of code stream blocks.

In an embodiment, a type of the data block included in group i of code stream blocks is determined based on content of the control block included in group i of code stream blocks and content of the data block included in group i of code stream blocks.

In an embodiment, the code block ID includes m bits, and m is an integer greater than or equal to 4.

In an embodiment, the code block ID has Hamming distance protection.

In an embodiment, the data unit includes a code block identifier ID, and the type and the code block ID indicate that the target code block is an error code block; and a control block included in each group of the $2^n$ groups of code stream blocks is a first value, a data block included in each group of the $2^n$ groups of code stream blocks is a second value, and the first value and the second value indicate that the code stream block is an error code stream block.

According to the decoding method provided in this application, the first decoding can be performed on different types of target code blocks to obtain $2^n$ groups of code stream blocks. Therefore, the method is widely applied.

In an embodiment, the obtaining a target code block includes: receiving second data, where the second data is obtained based on first data that is forward error correction FEC encoded; and performing second decoding on the second data to obtain the target code block, where the second decoding is error correction processing.

In an embodiment, the target code block is an error code block obtained when error correction is performed on the second data but the error correction fails.

In an embodiment, the obtaining a target code block includes: receiving second data, where the second data is obtained based on first data that is forward error correction FEC encoded; and performing second decoding on the second data to obtain the target code block, where the second decoding is error detection processing with error correction bypassed.

In an embodiment, the target code block is an error code block obtained when an error is detected from the second data but error correction is bypassed.

In an embodiment, the $2^n$ groups of code stream blocks are obtained by performing the first decoding on the target code block based on an error detection result and the type and the data unit of the target code block, and the error detection result is obtained based on the type and the data unit of the target code block.

In an embodiment, the error detection result includes a content sequence error or content error of the target code block, the $2^n$ groups of code stream blocks are obtained by performing the first decoding on a second code block based on a type and a data unit of the second code block, and the second code block is a code block that is obtained by converting the target code block and that has a same quantity of bits as the target code block. The target code block in which the error occurs is processed, so that a receive end can distinguish between error data and correct data, to ensure data reliability.

In an embodiment, the error detection result includes a content sequence error or content error of the target code block, the $2^n$ groups of code stream blocks are obtained by converting $2^n$ groups of first code stream blocks, and the $2^n$ groups of first code stream blocks are obtained by performing the first decoding on the target code block based on the type and the data unit of the target code block. The target code block in which the error occurs is processed, so that a receive end can distinguish between error data and correct data, to ensure data reliability.

In an embodiment, the control block includes t bits, the data block includes 8t bits, and t is a positive integer.

In an embodiment, a value of n is 2, a value of t is 8, and the target code block is 257 bits.

In an embodiment, all of the $2^n$ groups of code stream blocks are in a media independent interface MII format.

According to a third aspect, an encoding apparatus is provided. The apparatus includes:

- an obtaining module, configured to obtain $2^n$ groups of code stream blocks, where any group of code stream blocks includes a control block and a data block, and n is an integer greater than 1; and
- a first encoding module, configured to perform first encoding on the $2^n$ groups of code stream blocks to obtain a target code block, where the target code block includes a data unit and a type that is determined based on control blocks in the $2^n$ groups of code stream blocks, and the data unit is obtained by performing the first encoding on data blocks in the $2^n$ groups of code stream blocks in an encoding manner determined based on the control blocks and the data blocks in the $2^n$ groups of code stream blocks.

In an embodiment, the type indicates that the target code block is a data code block; and the data unit is obtained by performing the first encoding on the data blocks in the $2^n$ groups of code stream blocks based on a sequence of the $2^n$ groups of code stream blocks.

In an embodiment, the type indicates that the target code block is a control code block; and the data unit includes a code block identifier ID and code block content, where the code block content is obtained by performing the first encoding on the data blocks in the $2^n$ groups of code stream blocks based on a sequence determined based on the control blocks and the data blocks in the $2^n$ groups of code stream blocks, the code block ID is obtained based on the control blocks and the data blocks in the $2^n$ groups of code stream blocks, and the code block ID indicates a type of a data block in each group of code stream blocks and a location, in the code block content, of first-encoded content of each group of code stream blocks.

In an embodiment, the code block ID includes a first ID and a second ID, the first ID indicates the type of the data block in each group of code stream blocks, and the second ID indicates the location, in the code block content, of the first-encoded content of each group of code stream blocks.

In an embodiment, the code block ID includes m bits, and m is an integer greater than or equal to 4.

In an embodiment, the code block ID has Hamming distance protection.

In an embodiment, the target code block is an error code block, and the error code block includes error indication data.

In an embodiment, the target code block is obtained by processing the $2^n$ groups of code stream blocks based on an error detection result, and the error detection result is obtained based on the control blocks and the data blocks in the $2^n$ groups of code stream blocks.

In an embodiment, the error detection result includes a content sequence error or content error of the $2^n$ groups of code stream blocks, the target code block is obtained by performing the first encoding based on a code stream block that has a correct content sequence and correct content and an error block in the $2^n$ groups of code stream blocks, and the error block is obtained based on a code stream block that has a content sequence error or content error in the $2^n$ groups of code stream blocks.

In an embodiment, the control block includes t bits, the data block includes 8t bits, and t is a positive integer.

In an embodiment, a value of n is 2, a value of t is 8, and the target code block is 257 bits.

In an embodiment, all of the $2^n$ groups of code stream blocks are from a media independent interface MII.

In an embodiment, the apparatus further includes: a second encoding module, configured to perform second encoding on the target code block based on a forward error correction FEC code type, to obtain first data; and a sending module, configured to send the first data.

According to a fourth aspect, a decoding apparatus is provided. The apparatus includes:

- an obtaining module, configured to obtain a target code block, where the target code block includes a type and a data unit; and
- a decoding module, configured to perform first decoding on the target code block based on the type and the data unit of the target code block, to obtain $2^n$ groups of code stream blocks, where any group of code stream blocks includes a data block and a control block that is obtained based on the type and the data unit, the data block is obtained by performing the first decoding on the data unit in a decoding manner determined based on the type and the data unit, and n is an integer greater than 1.

In an embodiment, the type indicates that the target code block is a data code block; and a data block included in group i of code stream blocks in the $2^n$ groups of code stream blocks is obtained by performing the first decoding on content, in the data unit, that corresponds to group i of code stream blocks and that has a length of 8t, where t is a positive integer, and i is an integer greater than or equal to 1 and less than or equal to 2n, or i is an integer greater than or equal to 0 and less than or equal to $2^n$-1.

In an embodiment, the type indicates that the target code block is a control code block, the data unit includes a code block identifier ID and code block content, and the code block ID indicates a type of a data block in each group of code stream blocks and a location, in the code block content, of first-encoded content of each group of code stream blocks; and a control block included in group i of code stream blocks in the $2^n$ groups of code stream blocks is obtained based on the type and the code block ID, and a data block included in group i of code stream blocks in the $2^n$ groups of code stream blocks is obtained by performing the first decoding on the code block content in a decoding manner determined based on the type and the code block ID, where i is an integer greater than or equal to 1 and less than or equal to $2^n$, or i is an integer greater than or equal to 0 and less than or equal to $2^n$-1.

In an embodiment, the code block ID includes a first ID and a second ID, the first ID indicates the type of the data block in each group of code stream blocks, and the second ID indicates the location, in the code block content, of the first-encoded content of each group of code stream blocks; and the control block included in group i of code stream blocks is obtained based on the type, bits that are in the first ID and that correspond to group i of code stream blocks, and bits that are in the second ID and that correspond to group i of code stream blocks; and the data block included in group i of code stream blocks is obtained by performing the first decoding on the code block content in a decoding manner determined based on the type, the bits that are in the first ID and that correspond to group i of code stream blocks, and the bits that are in the second ID and that correspond to group i of code stream blocks.

In an embodiment, a type of the data block included in group i of code stream blocks is determined based on content of the control block included in group i of code stream blocks and content of the data block included in group i of code stream blocks.

In an embodiment, the code block ID includes m bits, and m is an integer greater than or equal to 4.

In an embodiment, the code block ID has Hamming distance protection.

In an embodiment, the data unit includes a code block identifier ID, and the type and the code block ID indicate that the target code block is an error code block; and a control block included in each group of the $2^n$ groups of code stream blocks is a first value, a data block included in each group of the $2^n$ groups of code stream blocks is a second value, and the first value and the second value indicate that the code stream block is an error code stream block.

In an embodiment, the obtaining module is configured to: receive second data, where the second data is obtained based on first data that is encoded by using a forward error correction FEC code type; and perform second decoding on the second data to obtain the target code block, where the second decoding is error correction processing.

In an embodiment, the target code block is an error code block obtained when error correction is performed on the second data but the error correction fails.

In an embodiment, the obtaining module is configured to: receive second data, where the second data is obtained based on first data that is encoded by using a forward error correction FEC code type; and perform second decoding on the second data to obtain the target code block, where the second decoding is error detection processing with error correction bypassed.

In an embodiment, the target code block is an error code block obtained when an error is detected from the second data but error correction is bypassed.

In an embodiment, the $2^n$ groups of code stream blocks are obtained by performing the first decoding on the target code block based on an error detection result and the type and the data unit of the target code block, and the error detection result is obtained based on the type and the data unit of the target code block.

In an embodiment, the error detection result includes a content sequence error or content error of the target code block, the $2^n$ groups of code stream blocks are obtained by performing the first decoding on a second code block based on a type and a data unit of the second code block, and the second code block is a code block that is obtained by converting the target code block and that has a same quantity of bits as the target code block.

In an embodiment, the error detection result includes a content sequence error or content error of the target code block, the $2^n$ groups of code stream blocks are obtained by converting $2^n$ groups of first code stream blocks, and the $2^n$ groups of first code stream blocks are obtained by performing the first decoding on the target code block based on the type and the data unit of the target code block.

In an embodiment, the control block includes t bits, the data block includes 8t bits, and t is a positive integer.

In an embodiment, a value of n is 2, a value of t is 8, and the target code block is 257 bits.

In an embodiment, all of the $2^n$ groups of code stream blocks are in a media independent interface MII format.

According to a fifth aspect, a network device is provided. The network device includes a processor, where the processor is coupled to a memory, the memory stores at least one program instruction or code, and the at least one program instruction or code is loaded and executed by the processor, to enable the network device to implement the encoding method according to any one of the first aspect or the possible implementations of the first aspect, or the decoding method according to any one of the second aspect or the possible implementations of the second aspect.

According to a sixth aspect, a computer-readable storage medium is provided. The storage medium stores at least one program instruction or code. When the program instruction or the code is loaded and executed by a processor, a computer is enabled to implement the encoding method according to any one of the first aspect or the possible implementations of the first aspect, or the decoding method according to any one of the second aspect or the possible implementations of the second aspect.

According to a seventh aspect, a communication system is provided. The system includes a first network device and a second network device, the first network device is configured to perform the encoding method according to any one of the first aspect or the possible implementations of the first aspect, and the second network device is configured to perform the decoding method according to any one of the second aspect or the possible implementations of the second aspect.

According to an eighth aspect, another communication apparatus is provided. The apparatus includes a transceiver, a memory, and a processor. The transceiver, the memory, and the processor communicate with each other through an internal connection path. The memory is configured to store instructions. The processor is configured to execute the instructions stored in the memory, to control the transceiver to receive a signal and control the transceiver to send a signal. In addition, when the processor executes the instructions stored in the memory, the processor is enabled to perform the encoding method according to any one of the first aspect or the possible implementations of the first aspect, or the decoding method according to any one of the second aspect or the possible implementations of the second aspect.

For example, there are one or more processors, and there are one or more memories.

For example, the memory may be integrated with the processor, or the memory and the processor are separately disposed.

In an embodiment, the memory may be a non-transitory memory, for example, a read-only memory (ROM). The memory and the processor may be integrated on a same chip, or may be separately disposed on different chips. A type of the memory and a manner of disposing the memory and the processor are not limited in this application.

According to a ninth aspect, a computer program product is provided. The computer program product includes computer program code. When the computer program code is run on a computer, the computer is enabled to perform the encoding method according to any one of the first aspect or the possible implementations of the first aspect, or the decoding method according to any one of the second aspect or the possible implementations of the second aspect.

According to a tenth aspect, a chip is provided. The chip includes a processor, configured to: invoke instructions from a memory, and run the instructions stored in the memory, to enable a communication device in which the chip is installed to perform the encoding method according to any one of the first aspect or the possible implementations of the first aspect, or the decoding method according to any one of the second aspect or the possible implementations of the second aspect.

According to an eleventh aspect, another chip is provided. The chip includes an input interface, an output interface, a processor, and a memory. The input interface, the output interface, the processor, and the memory are connected through an internal connection path. The processor is configured to execute code in the memory. When the code is executed, the processor is configured to perform the encoding method according to any one of the first aspect or the possible implementations of the first aspect, or the decoding method according to any one of the second aspect or the possible implementations of the second aspect.

BRIEF DESCRIPTION OF DRAWINGS

FIG. 1 is a schematic diagram of an implementation environment for an encoding method and a decoding method according to an embodiment of this application;

FIG. 2 is a flowchart of an encoding method according to an embodiment of this application;

FIG. 3 is a schematic diagram of a process of obtaining a target code block according to an embodiment of this application;

FIG. 4 is a schematic diagram of a structure of a target code block according to an embodiment of this application;

FIG. 8 is a schematic diagram of data blocks in four groups of code stream blocks according to an embodiment of this application;

FIG. 9 is a schematic diagram of data blocks in other four groups of code stream blocks according to an embodiment of this application;

FIG. 10 is a schematic diagram of data blocks in other four groups of code stream blocks according to an embodiment of this application;

FIG. 11 is a schematic diagram of a terminate block according to an embodiment of this application;

FIG. 12 is a schematic diagram of data blocks in other four groups of code stream blocks according to an embodiment of this application;

FIG. 13 is a schematic diagram of data blocks in other four groups of code stream blocks according to an embodiment of this application;

FIG. 14 is a schematic diagram of data blocks in other four groups of code stream blocks according to an embodiment of this application;

FIG. 15 is a schematic diagram of data blocks in other four groups of code stream blocks according to an embodiment of this application;

FIG. 19 is a flowchart of a decoding method according to an embodiment of this application;

FIG. 20 is a schematic diagram of a structure of another target code block according to an embodiment of this application;

FIG. 21 is a schematic diagram of a structure of an encoding apparatus according to an embodiment of this application;

DESCRIPTION OF EMBODIMENTS

Figure 5:
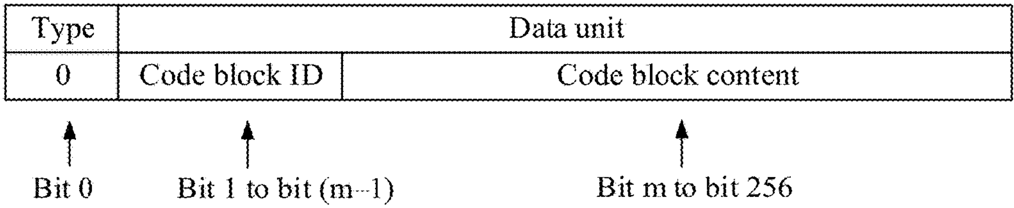
FIG. 5 is a schematic diagram of a structure of another target code block according to an embodiment of this application.

Terms used in implementations of this application are only used to explain embodiments of this application, and are not intended to limit this application. The following describes embodiments of this application with reference to the accompanying drawings.

In the field of communication technologies, as requirements for data transmission continuously increase, requirements for a transmission rate also continuously increase. An ethernet is a local area network technology. With rapid development of the ethernet, a rate of data transmission over the ethernet is increasing. For example, since a 100 gigabit ethernet (GE), data transmission is performed at a transmission rate of 25 Gb/s for a single lane. On the basis of ensuring fast data transmission, to ensure reliability of data transmission, FEC encoding is introduced to a physical layer when the ethernet is used for data transmission, so that an error bit in received data is corrected by transmitting FEC codewords obtained through the encoding. Because a check code exists in an FEC codeword, for a transmission rate needed for transmission of a same payload within same duration, a transmission rate needed for FEC codeword transmission is higher.

To reduce the transmission rate needed for the FEC codeword transmission, transcoding is used in an ethernet standard, to reduce overheads of a code block before FEC encoding, so as to reduce the transmission rate needed for the FEC codeword transmission. For example, every four 64B/66B encoded blocks are transcoded into one 256B/257B encoded block. Because overheads of one 257-bit code block are lower than overheads of four 66-bit code blocks, a transmission rate that is needed for FEC codeword transmission and that is obtained based on the 257-bit code block is low. When data transmission is performed through a 100G lane, a transmission rate that is needed for FEC codeword transmission and that is obtained based on transcoded code block transmission is 103.125 Gb/s, and the transmission rate is the same as a transmission rate needed for transmission of a 66-bit code block on which FEC encoding is not performed.

After obtaining the FEC codewords, a receive end decodes the FEC codewords to obtain the 257-bit code block, reversely transcodes the 257-bit code block into the four 66-bit code blocks, and decodes the four 66-bit code blocks to obtain a control block and a data block that are in an MII format. An error bit in an FEC codeword may be identified based on FEC error identification, and most processing at a PCS is performed based on a 257-bit code block. Therefore, 64B/66B encoding and decoding processes and a corresponding transcoding/reverse transcoding process generate unnecessary delay, power consumption, and chip area occupation.

Therefore, embodiments of this application provide an encoding method and a decoding method. In embodiments of this application, in an encoding process, a target code block is obtained without a need of performing 64B/66B encoding on each group of $2^n$ groups of code stream blocks and transcoding $2^n$ 66-bit code blocks. In a decoding process, $2^n$ groups of code stream blocks are obtained without a need of transcoding a target code block to obtain $2^n$ 66-bit code blocks and decoding the $2^n$ 66-bit code blocks. Therefore, both encoding efficiency and decoding efficiency are improved, and delay, power consumption, and chip area occupation caused by encoding and decoding processes are also reduced.

The encoding method and the decoding method provided in embodiments of this application are applicable to a current ethernet interface scenario or another scenario in which data transmission is needed. An implementation scenario shown in FIG. 1 is used as an example. The implementation scenario includes a plurality of chips, and information can be exchanged between the chips to implement data transmission. For example, both a chip 102 and a chip 104 support FEC encoding and FEC decoding, and a channel 105 between the chip 102 and the chip 104 can be used for transmission of FEC encoded data. In this case, the chip 102 may perform first encoding on $2^n$ groups of code stream blocks to obtain a target code block, perform second encoding on the target code block based on a first FEC code type to obtain first data, and send the first data to the chip 104 through the channel 105. For example, an error bit may occur during transmission of the first data through the channel 105, and received data is referred to as second data. After receiving the second data, the chip 104 may perform second decoding on the second data by using the first FEC code type to obtain the target code block, and perform first decoding on the target code block to obtain the $2^n$ groups of code stream blocks.

n is an integer greater than 1, and the first FEC code type includes but is not limited to any one or a cascaded combination of a plurality of an RS code, a Bose-Chaudhuri-Hocquenghem (BCH) code, a Hamming code, an extended-BCH code, an extended-Hamming code, a fire code, a turbo code, a turbo product code (TPC), a staircase code, and a low-density parity check (LDPC) code.

In an embodiment, the implementation scenario shown in FIG. 1 may include a plurality of network devices. The chip 102 is located on a first network device 101, and the chip 104 is located on a second network device 103. Each network device may include at least one chip. In FIG. 1, only an example in which there are two network devices and each network device includes one chip is used for description.

With reference to the implementation scenario shown in FIG. 1, an encoding method provided in an embodiment of this application is shown in FIG. 2. For example, the encoding method provided in an embodiment of the application is performed by the chip 102 in FIG. 1, and the method includes but is not limited to operation 201 and operation 202.

Operation 201: Obtain $2^n$ groups of code stream blocks, where any group of code stream blocks includes a control block and a data block, and n is an integer greater than 1.

A quantity of code stream blocks is not limited in an embodiment of the application, and n is an integer greater than 1. In an embodiment, all of the $2^n$ groups of code stream blocks are from an MII. A manner of obtaining the $2^n$ groups of code stream blocks based on the MII is not limited in an embodiment of the application. For example, the MII may be an MII defined in the Institute of Electrical and Electronics Engineers (IEEE) 802.3 standard, for example, the IEEE 802.3-2018 and another version of the IEEE 802.3 standard, for obtaining the $2^n$ groups of code stream blocks. For example, a value of n is 2, indicating that four groups of code stream blocks are obtained.

In an embodiment, for any group of the $2^n$ groups of code stream blocks, the control block in the any group of code stream blocks includes t bits, the data block in the any group of code stream blocks includes 8t bits, where t is a positive integer, 8t represents eight times of t, and 8t may alternatively be represented as 8*t. For example, a value of t is 8, for example, for any group of code stream blocks, the control block in the any group of code stream blocks includes eight bits, and the data block in the any group of code stream blocks includes 64 bits. In an embodiment, the t bits included in the control block are all control bits, in other words, the control block includes t control bits; and the 8t bits included in the data block are all data, in other words, the data block includes 8t-bit data.

For example, a control block including eight control bits is represented as TXC<7:0>, a data block including 64-bit data is represented as TXD<63:0>, and a sequence of all bits of the control block and the data block is from a most significant bit (MSB) to a least significant bit (LSB).

In an embodiment, the data included in TXD<63:0> includes but is not limited to MAC frame data and control data, and in TXD<63:0>, eight bits are used as a data segment. TXC<7:0> identifies each data segment in TXD<63:0>, to perform different processing on the MAC frame data and the control data, so as to correctly restore the MAC frame data and the control data on a receive side.

For example, for ease of the following description, a name of a data segment is defined. In TXD<63:0>, 8-bit MAC frame data is referred to as a data character, which is represented by/D/, and corresponds to TXC-0; and 8-bit control data is referred to as a control character, which is represented by/C/, and corresponds to TXC=1. For example, based on different meanings, the 8-bit control character (/C/) includes but is not limited to the following seven types: an error control character (error character,/E/), a start control character (start character,/S/), a terminate control character (terminate character,/T/), an ordered set control character (ordered set character,/O/), an idle control character (idle character,/I/), a low power idle control character (low power idle,/LI/), and another valid 8-bit control character. For a meaning and a value of the control character, refer to IEEE 802.3-2018. Details are not described again in an embodiment of the application.

For example, when a control block of a code stream block is a first specified value, a data block of the code stream block includes no control character, where the data block of the code stream block is referred to as a MAC frame data block (D), and a type of the code stream block is a data code stream block. The first specified value indicates that the type of the code stream block is the data code stream block. For example, the first specified value is 0x00, TXC<7:0> of a code stream block is 0x00, TXD<63:0> of the code stream block includes no control character, a data block of the code stream block is a MAC frame data block, and a type of the code stream block is a data code stream block. When a control block of a code stream block is not the first specified value, a data block of the code stream block includes at least one control character, the data block of the code stream block is referred to as a control data block (C), and a type of the code stream block is a control code stream block. For example, for TXC<7:0>!=0x00 of a code stream block, TXD<63:0> of the code stream block includes at least one control character, a data block of the code stream block is a control data block, and a type of the code stream block is a control code stream block. For example, based on different functions, the control data block (C) includes but is not limited to the following seven types: an error block (E), a start block(S), a terminate block (T), an ordered set block (O), an idle block (I), a low power idle block (LPI), and another control data block.

Operation 202: Perform first encoding on the $2^n$ groups of code stream blocks to obtain a target code block, where the target code block includes a data unit and a type that is determined based on control blocks in the $2^n$ groups of code stream blocks, and the data unit is obtained by performing the first encoding on data blocks in the $2^n$ groups of code stream blocks in an encoding manner determined based on the control blocks and the data blocks in the $2^n$ groups of code stream blocks.

For example, in each group of code stream blocks, each control block is eight bits, and each data block is 64 bits. The first encoding is performed on four groups of code stream blocks to obtain one 257-bit target code block. For example, the target code block is a 257-bit encoded block (257B encoded block). In an embodiment of the application, n=2 is used as an example for description. When n is another value, the first encoding may be performed on every four groups of code stream blocks, to obtain a plurality of target code blocks. For example, n=3, indicating that eight groups of code stream blocks are obtained. The first encoding may be performed on the first four groups of code stream blocks to obtain one target code block, and the first encoding may be performed on the last four groups of code stream blocks to obtain one target code block.

In an embodiment, the performing first encoding on the $2^n$ groups of code stream blocks to obtain a target code block includes but is not limited to the following encoding manner 1 and encoding manner 2.

In the encoding manner 1: a type of the target code block is determined as a data code block based on the control blocks in the $2^n$ groups of code stream blocks; the first encoding is performed on the data blocks in the $2^n$ groups of code stream blocks based on a sequence of the $2^n$ groups of code stream blocks, to obtain the data unit; and the target code block is obtained based on the type and the data unit.

For example, for the target code block obtained in the encoding manner 1, the type indicates that the target code block is the data code block; and the data unit is obtained by performing the first encoding on the data blocks in the $2^n$ groups of code stream blocks based on the sequence of the $2^n$ groups of code stream blocks.

In an embodiment, when each of the control blocks in the $2^n$ groups of code stream blocks is the first specified value, it is determined that the type of the target code block is the data code block. For example, the control block in each group of code stream blocks is represented as TXC<7:0>, and the first specified value is 0x00. When TXC<7:0> of each group of code stream blocks is 0x00, a type of each group of code stream blocks is a data code stream block.

In an embodiment, that the first encoding is performed on the data blocks in the $2^n$ groups of code stream blocks based on a sequence of the $2^n$ groups of code stream blocks, to obtain the data unit includes: separately using, based on the sequence of the $2^n$ groups of code stream blocks, bits included in the data blocks in the $2^n$ groups of code stream blocks as bits of the data unit, to obtain the data unit.

For example, j represents a sequence number of one group of four groups of code stream blocks, where j=0, 1, 2, or 3. TXD_j<63:0> represents a data block in group j of code stream blocks, tx_coded<256:0> represents a target code block, tx_coded<0> represents a type of the target code block, and tx_coded<(64j+64):(64j+1)> represents bit (64j+64) to bit (64j+1) of the target code block. In this case, each bit of tx_coded<256:0> is denoted in the following expression 1 and expression 2:

$$tx\_coded<0>=1 \quad \text{(Expression 1)}$$

$$tx\_coded<(64j+64):(64j+1)>=TXD\_j<63:0>, \text{ where } j=0,1,2, \text{ or } 3 \quad \text{(Expression 2)}$$

In the expression 1, tx_coded<0>=1 represents that the type is a data code block. In the expression 2, tx_coded<(64j+64):(64j+1)>=TXD_j<63:0> represents that a plurality of bits of a data block in each group of code stream blocks are separately used as a plurality of bits of a data unit.

For example, when j=0, tx_coded<64:1>=TXD_0<63:0> represents that bit 63 to bit 0 of a data block in group 0 of code stream blocks are respectively used as bit 64 to bit 1 of the target code block. When j=1, tx_coded<128:65>=TXD_1<63:0> represents that bit 63 to bit 0 of a data block in group 1 of code stream blocks are respectively used as bit 128 to bit 65 of the target code block. When j=2, tx_coded<192:129>=TXD_2<63:0> represents that bit 63 to bit 0 of a data block in group 2 of code stream blocks are respectively used as bit 192 to bit 129 of the target code block. When j=3, tx_coded<256:193>=TXD_3<63:0> represents that bit 63 to bit 0 of a data block in group 3 of code stream blocks are respectively used as bit 256 to bit 193 of the target code block.

For example, FIG. 3 is a schematic diagram of a process of obtaining a target code block. As shown in FIG. 3, for obtained four groups of code stream blocks, in each group of code stream blocks, each control block is represented as TXC<7:0>, and each data block is represented as TXD<63:0>. If TXC<7:0> in each of the four groups of code stream blocks is 0x00, a type of the target code block is a data code block. For example, the type of the target code block corresponds to bit 0 of the target code block, and bit 0 is set to 1, indicating that the type is the data code block. An embodiment of the application imposes no limitation on a manner in which bit 0 is set to a value to indicate that the type is the data code block. Based on a sequence of the four groups of code stream blocks, a plurality of bits of data blocks in the four groups of code stream blocks are separately used as a plurality of bits of a data unit, to obtain the data unit. Therefore, a target bit can be obtained based on the type and the data unit.

For example, a structure of the obtained target code block is shown in FIG. 4. Bit 0 of the target code block indicates a type of the target code block, and bit 0 is set to 1 to indicate that the type is a data code block. Bit 1 to bit 256 of the target code block indicate a data unit of the target code block, where D0 represents 64 bits of a data block in group 0 of code stream blocks, D1 represents 64 bits of a data block in group 1 of code stream blocks, D2 represents 64 bits of a data block in group 2 of code stream blocks, and D3 represents 64 bits of a data block in group 3 of code stream blocks.

In the encoding manner 2: a type of the target code block is determined as a control code block based on the control blocks in the $2^n$ groups of code stream blocks; a code block identifier (ID) is obtained based on the control blocks and the data blocks in the $2^n$ groups of code stream blocks, where the code block ID indicates a type of a data block in each group of code stream blocks and a location, in code block content, of first-encoded content of each group of code stream blocks; the first encoding is performed on the data blocks in the $2^n$ groups of code stream blocks based on a sequence determined based on the control blocks and the data blocks in the $2^n$ groups of code stream blocks, to obtain the code block content; and the target code block is obtained based on the type and the data unit, where the data unit includes the code block ID and the code block content. A value of the code block ID corresponds one-to-one to a combination of the $2^n$ groups of code stream blocks corresponding to the target code block. A correspondence between the value of the code block ID and the combination of the $2^n$ groups of code stream blocks may be set as required. For example, when the code block ID is 0x01, it indicates that the first group of the consecutive $2^n$ groups of code stream blocks corresponding to the target code block is a start of an ethernet frame, and all of subsequent $2^n$-1 groups of code stream blocks are data of the ethernet frame. Alternatively, when the code block ID is 0xF0, it indicates that group $2^n$ of the consecutive $2^n$ groups of code stream blocks corresponding to the target code block is termination (Terminate) of an ethernet frame, and all of the previous $2^n$-1 groups of code stream blocks are data of the ethernet frame. Alternatively, when the code block ID is 0xD1, it indicates that all code stream blocks of the consecutive $2^n$ groups of code stream blocks corresponding to the target code block are idle. The correspondence between the value of the code block ID and the combination of the $2^n$ groups of code stream blocks is not limited to the several cases listed in an embodiment of the application. This is not limited in this application. The values of the code block ID are examples, and are not limited to the values of the foregoing example in actual applications, provided that a one-to-one correspondence exists between the value of the code block ID and the combination of the $2^n$ groups of code stream blocks. This is not limited in an embodiment of the application.

For example, for the target code block obtained in the encoding manner 2, the type indicates that the target code block is the control code block; and the data unit includes the code block ID and the code block content, where the code block content is obtained by performing the first encoding on the data blocks in the $2^n$ groups of code stream blocks based on the sequence determined based on the control blocks and the data blocks in the $2^n$ groups of code stream blocks, the code block ID is obtained based on the control blocks and the data blocks in the $2^n$ groups of code stream blocks, and the code block ID indicates the type of the data block in each group of code stream blocks and the location, in the code block content, of the first-encoded content of each group of code stream blocks. For example, the sequence determined based on the control blocks and the data blocks in the $2^n$ groups of code stream blocks is a receiving sequence of the $2^n$ groups of code stream blocks.

In an embodiment, if a control block in at least one group of the $2^n$ groups of code stream blocks is a second specified value, it is determined that the type of the target code block is the control code block, where the second specified value indicates that a type of the code stream block is a control code stream block. In other words, when the type of the at least one group of the $2^n$ groups of code stream blocks is the control code stream block, the type of the target code block is the control code block. The second specified value is different from the first specified value. For example, the control block in each group of code stream blocks is represented as TXC<7:0>, and the first specified value is 0x00. When TXC<7:0> of at least one group of the groups of code stream blocks is the second specified value, that is, is not 0x00, the target code block is the control code block.

In an embodiment, that a code block ID is obtained based on the control blocks and the data blocks in the $2^n$ groups of code stream blocks includes: Types of the data blocks in the $2^n$ groups of code stream blocks are obtained based on the control blocks in the $2^n$ groups of code stream blocks, and the code block ID of the target code block is obtained based on the types of the data blocks in the groups of code stream blocks and a sequence of the groups of code stream blocks. For example, the code block ID includes m bits, and m is a positive integer greater than or equal to 4. For example, a structure of the target code block is shown in FIG. 5. The type corresponds to bit 0, the code block ID corresponds to bit (m−1) to bit 1, and the code block content corresponds to the remaining bits. For example, m=8 or m=12.

Figure 6:
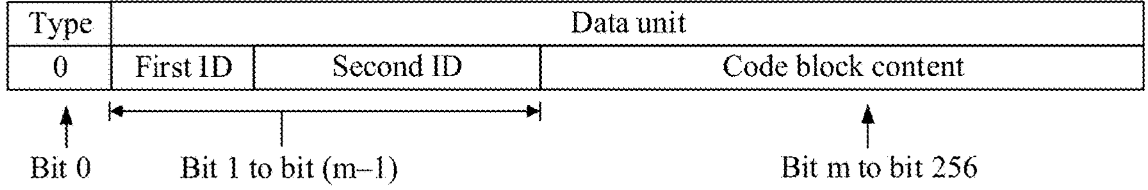
FIG. 6 is a schematic diagram of a structure of another target code block according to an embodiment of this application.
Figure 7:
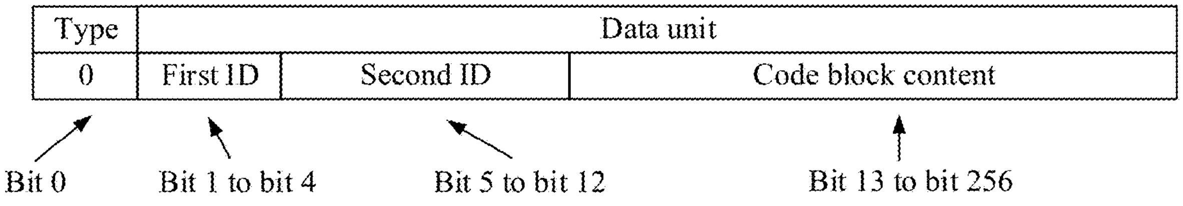
FIG. 7 is a schematic diagram of a structure of another target code block according to an embodiment of this application.

For example, the code block ID includes a first ID and a second ID, the first ID indicates the type of the data block in each group of code stream blocks, and the second ID indicates the location, in the code block content, of the first-encoded content of each group of code stream blocks. For example, a structure of the target code block is shown in FIG. 6. The type corresponds to bit 0, the code block ID corresponds to bit (m−1) to bit 1, and the code block content corresponds to the remaining bits. Bit (m−1) to bit 1 are divided into two parts, where the former part including least significant bits is the first ID, and the latter part including most significant bits is the second ID. For example, the code block ID is 12 bits, the former four least significant bits are the first ID, and the latter eight most significant bits are the second ID. A structure of the target code block is shown in FIG. 7. The type corresponds to bit 0, the first ID corresponds to bit 4 to bit 1, the second ID corresponds to bit 12 to bit 5, and the code block content corresponds to the remaining 244 bits. For example, the four bits included in the first ID respectively indicate types of data blocks in four groups of code stream blocks. For example, when a data block of a code stream block is a MAC frame data block, a bit corresponding to the code stream block is 1; or when a data block of a code stream block is a control data block, a bit corresponding to the code stream block is 0.

It should be noted that, regardless of the foregoing cases of the code block ID, the code block ID may have Hamming distance protection.

In an embodiment, for a plurality of cases of the type of the data block in each group of code stream blocks and the location, in the code block content, of the first-encoded content of each group of code stream blocks, code block IDs corresponding to the cases are different. In other words, unique code block IDs indicate the plurality of cases of the type of the data block in each group of code stream blocks and the location, in the code block content, of the first-encoded content of each group of code stream blocks. For example, four groups of code stream blocks are used as an example for description. Types of data blocks in the four groups of code stream blocks include but are not limited to the following case A1 to case A8.

Case A1: The data blocks in the four groups of code stream blocks include a data block whose type is an error block.

For example, for the case A1, for different quantities and different locations of data blocks whose types are the error block, the data blocks in the four groups of code stream blocks are shown in FIG. 8, where C0 represents a control data block of a type other than the error block. For example, for a case 1 in FIG. 8, a type of a data block in the first group of code stream blocks is the error block, and types of data blocks in the remaining three groups of code stream blocks may be a MAC frame data block or a control data block of a type other than the error block. A principle of another case in FIG. 8 is the same as that of the case 1. Details are not described herein again.

Case A2: The data blocks in the four groups of code stream blocks include only one data block whose type is a start block.

For example, for the case A2, for different locations of the data block whose type is the start block, the data blocks in the four groups of code stream blocks are shown in FIG. 9, where C1 represents a control data block of a type other than the start block, a terminate block, an error block, and an ordered set block. For example, for a case 1 in FIG. 9, a type of a data block in the first group of code stream blocks is the start block, and types of data blocks in the remaining three groups of code stream blocks are all MAC frame data blocks. For a case 2 in FIG. 9, a type of a data block in the first group of code stream blocks is C1, a type of a data block in the second group of code stream blocks is the start block, and types of data blocks in the remaining two groups of code stream blocks are MAC frame data blocks. For a case 3 in FIG. 9, types of data blocks in the first group of code stream blocks and the second group of code stream blocks are both C1, a type of a data block in the third group of code stream blocks is the start block, and a type of a data block in the fourth group of code stream blocks is a MAC frame data block. For a case 4 in FIG. 9, types of data blocks in the first group of code stream blocks to the third group of code stream blocks are all C1, and a type of a data block in the fourth group of code stream blocks is the start block.

Case A3: The data blocks in the four groups of code stream blocks include only one data block whose type is a terminate block.

For example, for the case A3, for different locations of the data block whose type is the terminate block, the data blocks in the four groups of code stream blocks are shown in FIG. 10, where C2 represents a control data block of a type other than a start block, the terminate block, an error block, and an ordered set block. For example, for a case 1 in FIG. 10, a type of a data block in the first group of code stream blocks is the terminate block, and types of data blocks in the remaining three groups of code stream blocks are all C2. For a case 2 in FIG. 10, a type of a data block in the first group of code stream blocks is a MAC frame data block, a type of a data block in the second group of code stream blocks is the terminate block, and types of data blocks in the remaining two groups of code stream blocks are C2. For a case 3 in FIG. 10, types of data blocks in the first group of code stream blocks and the second group of code stream blocks are both MAC frame data blocks, a type of a data block in the third group of code stream blocks is the terminate block, and a type of a data block in the fourth group of code stream blocks is C2. For a case 4 in FIG. 10, types of data blocks in the first group of code stream blocks to the third group of code stream blocks are all MAC frame data blocks, and a type of a data block in the fourth group of code stream blocks is the terminate block.

In an embodiment, when a data block includes a terminate control character (/T/), a type of the data block is a terminate block. For example, based on different locations of the terminate control character, different cases of the terminate block are shown in FIG. 11. In FIG. 11, the terminate block is 64 bits, and every eight bits are one byte; i indicates that the terminate control character is byte i of the terminate block, i=0, 1, 2, 3, 4, 5, 6, or 7;/C3/represents a control character other than the terminate control character; and a padding bit may be 0. For sorting of/T/,/D/,/C3/, and the padding bit in this implementation, refer to the sorting shown in FIG. 11. Details are not described herein again. In FIG. 11, a case in which i=0 may be referred to as a case 1, a case in which i=1 may be referred to as a case 2, and by analogy, a case in which i=7 may be referred to as a case 8.

It should be noted that, when the data blocks in the four groups of code stream blocks include only one data block whose type is the terminate block, for terminate blocks corresponding to terminate control characters at different locations, code block IDs are different. In other words, with reference to the case 1 to the case 4 shown in FIG. 10 and the case 1 to the case 8 shown in FIG. 11, code block IDs corresponding to the 32 cases are different.

Case A4: The data blocks in the four groups of code stream blocks include a data block whose type is an ordered set block, and include no data block whose type is a start block or a terminate block.

For example, for the case A4, for different quantities and different locations of data blocks whose types are the ordered set block, the data blocks in the four groups of code stream blocks are shown in FIG. 12, where C4 represents a control data block of a type other than the start block, the terminate block, an error block, and the ordered set block. For example, for a case 1 in FIG. 12, a type of a data block in the first group of code stream blocks is the ordered set block, and types of data blocks in the second group of code stream blocks to the fourth group of code stream blocks are all C4. For a case 2 in FIG. 12, a type of a data block in the second group of code stream blocks is the ordered set block, and types of data blocks in three groups of code stream blocks other than the second group of code stream blocks are C4. For other cases in FIG. 12, refer to types and a sequence of the data blocks in the groups of code stream blocks in FIG. 12. Details are not described herein again.

Case A5: The data blocks in the four groups of code stream blocks include a data block whose type is an ordered set block and a data block whose type is a start block, and include no data block whose type is a terminate block.

For example, for the case A5, for different quantities and different locations of data blocks whose types are the ordered set block and different locations of the data block whose type is the start block, the data blocks in the four groups of code stream blocks are shown in FIG. 13, where C5 represents a control data block of a type other than the start block, the terminate block, an error block, and the ordered set block. For example, for a case 1 in FIG. 13, a type of a data block in the first group of code stream blocks is the ordered set block, a type of a data block in the second group of code stream blocks is the start block, and types of data blocks in the remaining two groups of code stream blocks are all MAC frame data blocks. For a case 2, a type of a data block in the first group of code stream blocks is the ordered set block, a type of a data block in the second group of code stream blocks is C5, a type of a data block in the third group of code stream blocks is the start block, and a type of a data block in the fourth group of code stream blocks is a MAC frame data block. For other cases in FIG. 13, refer to types and a sequence of the data blocks in the groups of code stream blocks in FIG. 13. Details are not described herein again.

Case A6: The data blocks in the four groups of code stream blocks include a data block whose type is a terminate block and a data block whose type is an ordered set block, and include no data block whose type is a start block.

For example, for the case A6, for different locations of the data block whose type is the terminate block and different quantities and different locations of data blocks whose types are the ordered set block, the data blocks in the four groups of code stream blocks are shown in FIG. 14, where C6 represents a control data block of a type other than the start block, the terminate block, an error block, and the ordered set block. For example, for a case 1 in FIG. 14, a type of a data block in the first group of code stream blocks is the terminate block, a type of a data block in the second group of code stream blocks is the ordered set block, and types of data blocks in the remaining two groups of code stream blocks are all C6. For a case 2, a type of a data block in the first group of code stream blocks is the terminate block, a type of a data block in the third group of code stream blocks is the ordered set block, and types of data blocks in the remaining two groups of code stream blocks are all C6. For other cases in FIG. 14, refer to types and a sequence of the data blocks in the groups of code stream blocks in FIG. 14. Details are not described herein again.

In an embodiment, when a data block includes a terminate control character (/T/), a type of the data block is a terminate block. A case of the terminate block is the same as that of the terminate block in the case A3, that is, the terminate block is shown in FIG. 11. Details are not described herein again. For example, with reference to the case 1 to the case 11 shown in FIG. 14 and the case 1 to the case 8 shown in FIG. 11, code block IDs corresponding to the 88 cases are different.

Case A7: The data blocks in the four groups of code stream blocks include a data block whose type is a terminate block and a data block whose type is a start block.

For example, for the case A7, for different locations of the data block whose type is the terminate block and the data block whose type is the start block, the data blocks in the four groups of code stream blocks are shown in FIG. 15, where C7 represents a control data block of a type other than the start block, the terminate block, an error block, and an ordered set block. For example, for a case 1 in FIG. 15, a type of a data block in the first group of code stream blocks is the terminate block, a type of a data block in the second group of code stream blocks is the start block, and types of data blocks in the remaining two groups of code stream blocks are all MAC frame data blocks. For a case 2, a type of a data block in the first group of code stream blocks is the terminate block, a type of a data block in the second group of code stream blocks is C7, a type of a data block in the third group of code stream blocks is the start block, and a type of a data block in the fourth group of code stream blocks is a MAC frame data block. For other cases in FIG. 15, refer to types and a sequence of the data blocks in the groups of code stream blocks in FIG. 15. Details are not described herein again.

In an embodiment, when a data block includes a terminate control character (/T/), a type of the data block is a terminate block. A principle of the terminate block is the same as that of the terminate block in the case A3, that is, the terminate block is shown in FIG. 11. Details are not described herein again. For example, when the data block whose type is the terminate block is before the data block whose type is the start block, with reference to the case 1 to the case 6 shown in FIG. 15 and the case 1 to the case 8 shown in FIG. 11, code block IDs corresponding to the 48 cases are different. When the data block whose type is the start block is before the data block whose type is the terminate block, it indicates that the four groups of code stream blocks correspond to a 32-byte data packet, and a terminate control character is the seventh byte of the terminate block, that is, the case 8 shown in FIG. 11.

Case A8: The data blocks in the four groups of code stream blocks include a data block whose type is a terminate block, a data block whose type is an ordered set block, and a data block whose type is a start block.

Figures 16, 17, 18:
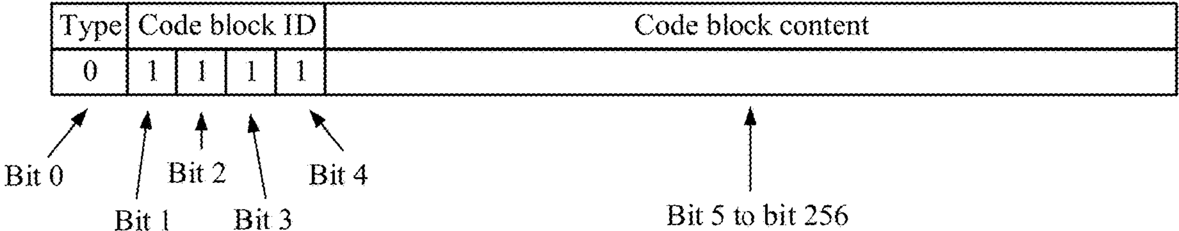
FIG. 16 is a schematic diagram of data blocks in other four groups of code stream blocks according to an embodiment of this application.
FIG. 17 is a schematic diagram of data blocks in other four groups of code stream blocks according to an embodiment of this application.
FIG. 18 is a schematic diagram of a structure of another target code block according to an embodiment of this application.

For example, for the case A8, for different locations of the data block whose type is the terminate block, different locations of the data block whose type is the start block, and different quantities and different locations of data blocks whose types are the ordered set block, the data blocks in the four groups of code stream blocks are shown in FIG. 16, where C8 represents a control data block of a type other than the start block, the terminate block, an error block, and the ordered set block. For example, for a case 1 in FIG. 16, a type of a data block in the first group of code stream blocks is the terminate block, a type of a data block in the second group of code stream blocks is the ordered set block, a type of a data block in the third group of code stream blocks is the start block, and a type of a data block in the fourth group of code stream blocks is a MAC frame data block. For a case 2, a type of a data block in the first group of code stream blocks is the terminate block, a type of a data block in the second group of code stream blocks is the ordered set block, a type of a data block in the third group of code stream blocks is C8, and a type of a data block in the fourth group of code stream blocks is the start block. For other cases in FIG. 16, refer to types and a sequence of the data blocks in the groups of code stream blocks in FIG. 16. Details are not described herein again.

In an embodiment, when a data block includes a terminate control character (/T/), a type of the data block is a terminate block. A principle of the terminate block is the same as that of the terminate block in the case A3, that is, the terminate block is shown in FIG. 11. Details are not described herein again. For example, with reference to the case 1 to the case 5 shown in FIG. 16 and the case 1 to the case 8 shown in FIG. 11, code block IDs corresponding to the 40 cases are different.

It should be noted that, for various cases included in the case A1 to the case A8, code block IDs corresponding to the cases are different. Values of the code block IDs corresponding to the various cases are not limited in an embodiment of the application.

For example, for the case in which types of data blocks in three groups of the four groups of code stream blocks in the case A1 to the case A8 are MAC frame data blocks, the code block ID includes but is not limited to two cases: Case 1: When a type of a data block in the first group of code stream blocks is the start block, and types of data blocks in the remaining three groups of code stream blocks are all MAC frame data blocks, the code block ID is 0x5E, for example, bit 1 to bit 8 of the target code block are 01111010. Case 2: When types of data blocks in the first three groups of code stream blocks are all MAC frame data blocks, and a type of a data block in the fourth group of code stream blocks is the terminate block, corresponding to the case 1 to the case 8 in FIG. 11, code block IDs are respectively 0x07, 0x17, 0x27, 0x37, 0x47, 0x57, 0x67, and 0x77. In either of the case 1 or the case 2, an LSB is the first sent bit.

For example, for a case other than the case 1 and the case 2 in the case A1 to the case A8, the code block ID is 12 bits, and the first eight bits of the code block ID are different from those of the code block IDs in the case 1 and the case 2.

In an embodiment, that the first encoding is performed on the data blocks in the $2^n$ groups of code stream blocks based on a sequence determined based on the control blocks and the data blocks in the $2^n$ groups of code stream blocks, to obtain the code block content includes: The data blocks in the $2^n$ groups of code stream blocks are compressed based on the sequence determined based on the control blocks and the data blocks in the $2^n$ groups of code stream blocks, to obtain the code block content. For example, that the data blocks in the $2^n$ groups of code stream blocks are compressed includes: Each bit whose value is 0 in the data blocks in the $2^n$ groups of code stream blocks is compressed. For example, each bit of an idle block is 0. When the types of the data blocks in the $2^n$ groups of code stream blocks are idle blocks, each bit of the idle block is compressed.

In conclusion, the target code block can be obtained based on the type, the code block ID, and the code block content in various cases.

In an embodiment, the target code block is an error code block, and the error code block includes error indication data. For example, when not all of the $2^n$ groups of code stream blocks are data code stream blocks, and all of the $2^n$ groups of code stream blocks do not belong to any one of the foregoing cases A1 to A8, it is determined that the target code block is an error code block, and the code block ID and the code block content of the target code block are obtained, where the type and the code block ID are used as error indication data in the error code block. For example, bit 0 of the target code block corresponds to the type, and bit 4 to bit 1 correspond to the code block ID, where bit 0 is set to 0, and bit 4 to bit 1 are all set to 1s.

In an embodiment, data blocks in four groups of code stream blocks are shown in FIG. 17, where 0, 1, 2, and 3 indicate a sequence of the four groups of code stream blocks, C indicates that a type of a data block of a code stream block is a control data block, and D indicates that a type of a data block of a code stream block is a MAC frame data block. For example, for a combination 0, types of the data blocks in the four groups of code stream blocks are all control data blocks. For example, for each combination in FIG. 17, when all of the types of the data blocks in the four groups of code stream blocks are not MAC frame data code stream blocks, and also do not belong to any one of the foregoing cases A1 to A8, it is determined that the target code block is an error code block. For example, for two groups of code stream blocks whose data block types are both MAC frame data blocks, when a type of a data block in one group of the two groups of code stream blocks is any one of a start block, an ordered set block, an idle block, or a low power idle block, the target code block is an error code block.

In an embodiment, when the target code block is an error code block, a structure of the target code block is shown in FIG. 18. Bit 0 of the target code block corresponds to the type, and bit 0 is 0. Bit 4 to bit 1 correspond to the code block ID, and bit 4 to bit 1 are all 1s. Bit 256 to bit 5 correspond to the code block content. For example, the first four bits of the code block content are 0xE, and every eight bits thereafter are 0x1E. For another example, each bit of the code block content is 0.

In another possible implementation, when the target code block is an error code block, a length of the code block ID of the target code block is not limited to the four bits shown in FIG. 18. For example, the length of the code block ID is eight bits. Bit 0 of the target code block corresponds to the type, and bit 0 is 0. Bit 8 to bit 1 correspond to the code block ID, and bit 8 to bit 1 are all 1s. Bit 256 to bit 9 correspond to the code block content. For example, every eight bits of the code block content are 0x1E. For another example, each bit of the code block content is 0.

According to the encoding method provided in an embodiment of the application, the first encoding can be performed on different types of code stream blocks to obtain the target code block. Therefore, the method is widely applied.

In an embodiment, the performing first encoding on the $2^n$ groups of code stream blocks to obtain a target code block includes: obtaining an error detection result based on the control blocks and the data blocks in the $2^n$ groups of code stream blocks; and processing the $2^n$ groups of code stream blocks based on the error detection result, and performing the first encoding on processed $2^n$ groups of code stream blocks to obtain the target code block. In other words, the target code block is obtained by processing the $2^n$ groups of code stream blocks based on the error detection result, and the error detection result is obtained based on the control blocks and the data blocks in the $2^n$ groups of code stream blocks.

For example, the obtaining an error detection result based on the control blocks and the data blocks in the $2^n$ groups of code stream blocks includes: obtaining content and a content sequence of the $2^n$ groups of code stream blocks based on the control blocks and the data blocks in the $2^n$ groups of code stream blocks, and obtaining the error detection result based on the content and the content sequence of the $2^n$ groups of code stream blocks. For example, when the content sequence of the $2^n$ groups of code stream blocks is at least one case in a first error case set, an error occurs in the content sequence of the $2^n$ groups of code stream blocks; or when the content sequence of the $2^n$ groups of code stream blocks is not any case in the first error case set, the content sequence of the $2^n$ groups of code stream blocks is correct. For another example, when the content of the $2^n$ groups of code stream blocks is at least one case in a second error case set, an error occurs in the content of the $2^n$ groups of code stream blocks.; or when the content of the $2^n$ groups of code stream blocks is not any case in the second error case set, the content of the $2^n$ groups of code stream blocks is correct.

In an embodiment, two adjacent groups of code stream blocks are used as an example for description, and the first error case set includes but is not limited to the following four cases.

(1) When a type of a data block in the former group of code stream blocks is a start block, a type of a data block in the latter group of code stream blocks is a type other than MAC frame data.

(2) When a type of a data block in the former group of code stream blocks is MAC frame data, a type of a data block in the latter group of code stream blocks is a type other than the MAC frame data or a terminate block.

(3) When a type of a data block in the former group of code stream blocks is a terminate block, a type of a data block in the latter group of code stream blocks is a type other than an idle block or an ordered set block.

(4) When a type of a data block in the former group of code stream blocks is an idle block or an ordered set block, a type of a data block in the latter group of code stream blocks is MAC frame data or a terminate block.

In an embodiment, one group of code stream blocks is used as an example for description, and the second error case set includes but is not limited to the following four cases.

(1) For a code stream block in which a data block includes a start control character, the start control character is followed by other content than a data character.

(2) For a code stream block in which a data block includes a data character, the data character is followed by other content than the data character or a terminate control character.

(3) For a code stream block in which a data block includes a terminate control character, the terminate control character is followed by other content than an idle control character or an ordered set control character.

(4) For a code stream block in which a data block includes an idle control character or an ordered set control character, the idle control character or the ordered set control character is followed by a data character or a terminate control character.

For example, the error detection result includes a content sequence error or content error of the $2^n$ groups of code stream blocks, an error block is obtained based on a code stream block that has a content sequence error or content error in the $2^n$ groups of code stream blocks, and the first encoding is performed on a code stream block that has a correct content sequence and correct content and the error block in the $2^n$ groups of code stream blocks to obtain the target code block. In other words, when the error detection result includes the content sequence error or the content error of the $2^n$ groups of code stream blocks, the target code block is obtained by performing the first encoding based on the code stream block that has the correct content sequence and correct content and the error block in the $2^n$ groups of code stream blocks, where the error block is obtained based on the code stream block that has the content sequence error or content error in the $2^n$ groups of code stream blocks. For example, the error block includes an error control character. For example, for a code stream block that has a content sequence error or content error, content of the code stream block is converted into an error control character to obtain an error block.

For example, that the first encoding is performed on a code stream block that has a correct content sequence and correct content and the error block in the $2^n$ groups of code stream blocks to obtain the target code block includes: The type of the target code block is determined as a control code block; and the code block ID is obtained based on the code stream block that has the correct content sequence and correct content and the error block in the $2^n$ groups of code stream blocks; and the first encoding is performed, based on the sequence determined based on the control blocks and the data blocks in the $2^n$ groups of code stream blocks, on the error block and a data block in the code stream block that has the correct content sequence and correct content in the $2^n$ groups of code stream blocks, to obtain the code block content. In an embodiment, the error block is the error block in the foregoing case A1, and a manner of obtaining the code block ID and the code block content is the same as a principle of related content in the foregoing case A1. Details are not described herein again.

For example, when each group of the $2^n$ groups of code stream blocks are a code stream block that has a content sequence error or content error, $2^n$ error blocks are obtained based on the $2^n$ groups of code stream blocks, and the first encoding is performed on the $2^n$ error blocks to obtain a target code block, where the target code block is an error code block.

A code stream block in which an error occurs is processed, so that data in which an error occurs can be distinguished from correct data in subsequent data transmission, to ensure data reliability.

For example, after the target code block is obtained, the method further includes: performing second encoding on the target code block based on an FEC code type, to obtain first data; and sending the first data. A manner of performing the second encoding on the target code block based on the FEC code type is not limited in an embodiment of the application. The second encoding is performed on the target code block based on the FEC code type to obtain the first data, so that a receive end can perform error correction on the received first data, to ensure data transmission accuracy.

According to the encoding method provided in an embodiment of the application, the target code block is obtained by performing the first encoding on the $2^n$ groups of code stream blocks including the control blocks and the data blocks, without a need of performing 64B/66B encoding on each group of the $2^n$ groups of code stream blocks to obtain $2^n$ 66-bit code blocks and transcoding the $2^n$ 66-bit code blocks. Therefore, encoding efficiency is improved, and delay, power consumption, and chip area occupation caused by the encoding process are reduced.

The foregoing describes the encoding method provided in embodiments of this application. The following describes a decoding method provided in embodiments of this application. With reference to the implementation scenario shown in FIG. 1, a decoding method provided in an embodiment of this application is shown in FIG. 19. For example, the decoding method provided in an embodiment of the application is performed by the chip 104 in FIG. 1, and the method includes but is not limited to operation 1901 and operation 1902.

Operation 1901: Obtain a target code block, where the target code block includes a type and a data unit.

For example, with reference to the implementation scenario in FIG. 1, the chip 102 sends, to the chip 104 through the channel 105, first data encoded by using an FEC code type. In a data transmission process, an error bit may occur in the first data. The data in which the error bit occurs is referred to as second data, and the chip 104 receives the second data through the channel 105.

In an embodiment, the obtaining a target code block includes but is not limited to the following manner A and manner B.

Manner A: The second data is received, where the second data is obtained based on the first data that is encoded by using the FEC code type; and second decoding is performed on the second data to obtain the target code block, where the second decoding is error correction processing.

For example, the target code block is an error code block obtained when error correction is performed on the second data but the error correction fails. For example, that second decoding is performed on the second data to obtain the target code block includes: The second data is processed based on the FEC code type to obtain a first codeword, error correction processing is performed on the first codeword, and the target code block is obtained based on a result of the error correction processing.

For example, the chip 104 has a function of an FEC decoder. When the FEC decoder determines that a quantity of error bits exceeds an error correction capability of the FEC decoder, in other words, when determining that error correction cannot be performed on the first codeword, the FEC decoder identifies all code blocks in the first codeword as error code blocks. Therefore, when the result of the error correction processing is that all the code blocks in the first codeword are identified as the error code blocks, the obtained target code block is the error code block.

For example, when the result of the error correction processing is that the error correction on the first codeword succeeds, a code block obtained based on the corrected first codeword is used as the obtained target code block, and the code block obtained based on the corrected first codeword is a code block that is successfully corrected.

Manner B: The second data is received, where the second data is obtained based on the first data that is encoded by using the FEC code type; and second decoding is performed on the second data to obtain the target code block, where the second decoding is error detection processing with error correction bypassed.

For example, the target code block is an error code block obtained through the error detection processing with error correction bypassed on the second data. For example, that second decoding is performed on the second data to obtain the target code block includes: The second data is processed based on the FEC code type to obtain a first codeword, error detection and bypass correction processing is performed on the first codeword; and the target code block is obtained based on a result of the error detection processing with error correction bypassed.

For example, the chip 104 has a function of an FEC decoder. When detecting that an error exists in the first codeword, the FEC decoder identifies all code blocks in the first codeword as error code blocks. Therefore, when the result of the error detection processing with error correction bypassed is that all the code blocks in the first codeword are identified as the error code blocks, the obtained target code block is the error code block.

For example, when the result of the error detection processing with error correction bypassed is that the first codeword is error free, a code block obtained based on the first codeword is used as the obtained target code block, and the code block obtained based on the first codeword is an error-free code block.

For example, a frame check sequence (FCS) frame check performed based on the target code block fails. For example, the target code block is 257 bits, the first five bits are 01111, and the remaining 252 bits include but are not limited to the following four cases.

(1) Each bit remains unchanged.

(2) The first four bits are 0x1 or 0xE, and every eight bits in the remaining bits are 0x1E.

(3) In the first 248 bits, every eight bits are 0x1E, and the last four bits are 0x1 or 0xE.

(4) Each bit is 0.

For example, the target code block is shown in FIG. 20, where b represents a bit.

Operation 1902: Perform first decoding on the target code block based on the type and the data unit of the target code block, to obtain $2^n$ groups of code stream blocks, where any group of code stream blocks includes a data block and a control block that is obtained based on the type and the data unit, the data block is obtained by performing the first decoding on the data unit in a decoding manner determined based on the type and the data unit, and n is an integer greater than 1.

For example, the target code block is 257 bits, and in each group of code stream blocks, the control block is eight bits and the data block is 64 bits. An example in which the first decoding is performed on one target code block to obtain four groups of code stream blocks (n=2) is used for description. When a plurality of target code blocks are obtained, the first decoding may be performed on each target code block, to obtain $2^n$ groups of code stream blocks. For example, when two target code blocks are obtained, the first decoding may be performed on each of the two code blocks to obtain four groups of code stream blocks, in other words, the first decoding is performed on the two target code blocks to obtain eight groups of code stream blocks.

In an embodiment, the performing first decoding on the target code block based on the type and the data unit of the target code block, to obtain $2^n$ groups of code stream blocks includes but is not limited to the following decoding manner 1 to decoding manner 3.

In the decoding manner 1, the type of the target code block is determined as a data code block based on the type of the target code block, where the data unit of the target code block includes $2^n$ pieces of content each having a length of 8t, and t is a positive integer; and the control blocks in the $2^n$ groups of code stream blocks are obtained based on the type of the target code block, and the first decoding is separately performed on the $2^n$ pieces of content, each having the length of 8t, included in the data unit, to obtain the data blocks in the $2^n$ groups of code stream blocks.

For example, when the type indicates that the target code block is the data code block, the first decoding is performed on the target code block in the decoding manner 1 to obtain the $2^n$ groups of code stream blocks. A data block included in group i of code stream blocks in the $2^n$ groups of code stream blocks is obtained by performing the first decoding on content, in the data unit, that corresponds to group i of code stream blocks and that has a length of 8t, where i is an integer greater than or equal to 1 and less than or equal to $2^n$, or i is an integer greater than or equal to 0 and less than or equal to $2^n$-1.

In an embodiment, the type of the target code block is 1, indicating that the target code block is the data code block, the data unit of the target code block includes four pieces of content each having a length of 8t, and one piece of content having the length of 8t corresponds to one group of code stream blocks. For example, the length of 8t is 64 bits. Control blocks in the four groups of code stream blocks are all set to 0x00, and the four pieces of 64-bit content are respectively used as content of data blocks in the four groups of code stream blocks.

For example, j represents a sequence number of one group of the four groups of code stream blocks, where j=0, 1, 2, or 3. RXC_j<7:0> represents a control block in group j of code stream blocks, RXD_j<63:0> represents a data block in group j of code stream blocks, rx_coded<256:0> represents the target code block, rx_coded<0> represents the type of the target code block, rx_coded<(64j+64):(64j+1)> represents bit (64j+64) to bit (64j+1) of the target code block, and content of RXC_j<7:0> and RXD_j<63:0> is denoted in the following expression 3 and expression 4:

$$RXC\_j<7:0>=0\times 00,\ \text{where } j=0,1,2,\text{ or }3 \quad \text{(Expression 3)}$$

$$RXD\_j<63:0>=rx\_coded<(64j+64):(64j+1)>,\ \text{where } j=0,1,2,\text{ or }3 \quad \text{(Expression 4)}$$

In the expression 3, RXC_j<7:0>=0x00 indicates that the control block in each group of code stream blocks is 0x00. In the expression 4, RXD_j<63:0>=rx_coded<(64j+64):(64j+1)> indicates that every 64 bits of the data unit are used as 64 bits of the data block in one group of code stream blocks.

For example, when j=0, RXD_0<63:0>=rx_coded<64:1> indicates that bit 64 to bit 1 of the target code block are respectively used as bit 63 to bit 0 of the data block in group 0 of code stream blocks. When j=1, RXD_1<63:0>=rx_coded<128:65> indicates that bit 128 to bit 65 of the target code block are respectively used as bit 63 to bit 0 of the data block in group 1 of code stream blocks. When j=2, RXD_2<63:0>=rx_coded<192:129> indicates that bit 192 to bit 129 of the target code block are respectively used as bit 63 to bit 0 of the data block in group 2 of code stream blocks. When j=3, RXD_3<63:0>=rx_coded<256:193> indicates that bit 256 to bit 193 of the target code block are respectively used as bit 63 to bit 0 of the data block in group 3 of code stream blocks.

In the decoding manner 2, the type of the target code block is determined as a control code block based on the type of the target code block, where the data unit of the target code block includes a code block ID and code block content, the code block ID indicates a type of a data block in each group of code stream blocks and a location, in the code block content, of first-encoded content of each group of code stream blocks; and the control blocks in the $2^n$ groups of code stream blocks are obtained based on the type and the code block ID, and the first decoding is performed on the code block content in a decoding manner determined based on the type and the code block ID, to obtain the data blocks in the $2^n$ groups of code stream blocks.

For example, when the type indicates that the target code block is the control code block, the first decoding is performed on the target code block in the decoding manner 2 to obtain the $2^n$ groups of code stream blocks. A control block included in group i of code stream blocks in the $2^n$ groups of code stream blocks is obtained based on the type and the code block ID, and a data block included in group i of code stream blocks in the $2^n$ groups of code stream blocks is obtained by performing the first decoding on the code block content in a decoding manner determined based on the type and the code block ID, where i is an integer greater than or equal to 1 and less than or equal to $2^n$, or i is an integer greater than or equal to 0 and less than or equal to $2^n$-1.

In an embodiment, the code block ID includes a first ID and a second ID, the first ID indicates the type of the data block in each group of code stream blocks, and the second ID indicates the location, in the code block content, of the first-encoded content of each group of code stream blocks. That the control blocks in the $2^n$ groups of code stream blocks are obtained based on the type and the code block ID, and the first decoding is performed on the code block content in a decoding manner determined based on the type and the code block ID, to obtain the data blocks in the $2^n$ groups of code stream blocks includes: The control blocks included in the $2^n$ groups of code stream blocks are obtained based on the type, bits that are in the first ID and that correspond to the $2^n$ groups of code stream blocks, and bits that are in the second ID and that corresponds to the $2^n$ groups of code stream blocks, and the first decoding is performed on the code block content in a decoding manner determined based on the type, the bits that are in the first ID and that correspond to the $2^n$ groups of code stream blocks, and the bits that are in the second ID and that corresponds to the $2^n$ groups of code stream blocks, to obtain the data blocks in the $2^n$ groups of code stream blocks.

In other words, the control block included in group i of code stream blocks is obtained based on the type, bits that are in the first ID and that correspond to group i of code stream blocks, and bits that are in the second ID and that correspond to group i of code stream blocks; and the data block included in group i of code stream blocks is obtained by performing the first decoding on the code block content in a decoding manner determined based on the type, the bits that are in the first ID and that correspond to group i of code stream blocks, and the bits that are in the second ID and that correspond to group i of code stream blocks.

For example, a type of the data block included in group i of code stream blocks is determined based on content of the control block included in group i of code stream blocks and content of the data block included in group i of code stream blocks.

Because a plurality of cases of the type of the data block in each group of code stream blocks and the location, in the code block content, of the first-encoded content of each group of code stream blocks are indicated by using the unique code block ID, the type of the data block in each group of code stream blocks and the location, in the code block content, of the first-encoded content of each group of code stream blocks can be obtained based on the code block ID of the target code block, so that the decoding manner of the target code block can be determined based on the type and the code block ID. Therefore, the control blocks in the $2^n$ groups of code stream blocks can be obtained based on the type and the code block ID, and the first decoding is performed on the code block in the decoding manner determined based on the type and the code block ID, to obtain the code block content.

In the decoding manner 3, based on the type and the data unit of the target code block, the type of the target code block is determined as an error code block; and a control block included in each group of the $2^n$ groups of code stream blocks is set to a first value, and a data block included in each group of the $2^n$ groups of code stream blocks is set to a second value, and the first value and the second value indicate that the code stream block is an error code stream block.

For example, the data unit includes a code block ID, and the type and the code block ID indicate that the target code block is the error code block; and the control block included in each group of the $2^n$ groups of code stream blocks is the first value, the data block included in each group of the $2^n$ groups of code stream blocks is the second value, and the first value and the second value indicate that the code stream block is the error code stream block. For example, the type of the target code block is 0, the code block ID is 1111, the target code block is the error code block, the control block included in each group of the $2^n$ groups of code stream blocks obtained through the first decoding is 0xFF, and the data block included in each group of the $2^n$ groups of code stream blocks is 0xFEFEFEFE.

According to the decoding method provided in an embodiment of the application, the first decoding can be performed on different types of target code blocks to obtain $2^n$ groups of code stream blocks. Therefore, the method is widely applied.

In an embodiment, the performing first decoding on the target code block based on the type and the data unit of the target code block, to obtain $2^n$ groups of code stream blocks includes: obtaining an error detection result based on the type and the data unit of the target code block; and performing the first decoding on the target code block based on the error detection result, and the type and the data unit of the target code block, to obtain the $2^n$ groups of code stream blocks. In other words, the $2^n$ groups of code stream blocks are obtained by performing the first decoding on the target code block based on the error detection result and the type and the data unit of the target code block, and the error detection result is obtained based on the type and the data unit of the target code block.

For example, the obtaining an error detection result based on the type and the data unit of the target code block includes: obtaining content and a content sequence of the target code block based on the type and the data unit of the target code block, and obtaining the error detection result based on the content and the content sequence of the target code block. For example, when the content sequence of the target code block is at least one case in a third error case set, an error occurs in the content sequence of the target code block; or when the content sequence of the target code block is not any case in the third error case set, the content sequence of the target code block is correct. For another example, when the content of the target code block is at least one case in a fourth error case set, an error occurs in the content of the target code block; or when the content of the target code block is not any case in the fourth error case set, the content of the target code block is correct.

In an embodiment, an example in which the target code block is a control code block and the target code block includes four bit groups is used for description. One bit group corresponds to one group of code stream blocks obtained through the first decoding. For two adjacent bit groups, the fourth error case set includes but is not limited to the following four cases.

(1) When the former bit group includes a start control character (/S/), the latter bit group includes other content than a data character (/D/).

(2) When the former bit group includes only a data character, the latter bit group includes other content than the data character or a terminate control character (/T/).

(3) When the former bit group includes a terminate control character, the latter bit group includes other content than an idle control character (/I/) or a sequence ordered set control character (/O/).

(4) When the former bit group includes an idle control character or a sequence ordered set control character, the latter bit group includes a data character or a terminate control character.

In an embodiment, one bit group is used as an example for description, and the fourth error case set includes but is not limited to the following four cases.

(1) For a bit group including a start control character, the start control character is followed by other content than a data character.

(2) For a bit group including a data character, the data character is followed by other content than the data character or a terminate control character.

(3) For a bit group including a terminate control character, the terminate control character is followed by other content than an idle control character or a sequence ordered set control character.

(4) For a bit group including an idle control character or a sequence ordered set control character, the idle control character or the sequence ordered set control character is followed by a data character or a terminate control character.

In an embodiment, the error detection result includes a content sequence error or content error of the target code block, and the performing the first decoding on the target code block based on the error detection result, and the type and the data unit of the target code block, to obtain the $2^n$ groups of code stream blocks includes: converting the target code block to obtain a second code block, and performing the first decoding on the second code block based on a type and a data unit of the second code block to obtain $2^n$ groups of code stream blocks, where the second code block is a code block that is obtained by converting the target code block and that has a same quantity of bits as the target code block. In other words, the $2^n$ groups of code stream blocks are obtained by performing the first decoding on the second code block based on the type and the data unit of the second code block, and the second code block is a code block that is obtained by converting the target code block and that has a same quantity of bits as the target code block.

For example, the converting the target code block to obtain a second code block includes: for a bit group that is in the target code block and that has a content sequence error or content error, converting the bit group that has the content sequence error or content error into an error control character; and obtaining the second code block based on the error control character and a bit group that is in the target code block and that has a correct content sequence and correct content. In an embodiment, the second code block obtained through the conversion is a control code block, and the first decoding may be performed on the second code block in the decoding manner 2.

In another possible implementation, the error detection result includes a content sequence error or content error of the target code block, and the performing the first decoding on the target code block based on the error detection result, and the type and the data unit of the target code block, to obtain the $2^n$ groups of code stream blocks includes: performing the first decoding on the target code block based on the type and the data unit of the target code block to obtain $2^n$ groups of first code stream blocks, and converting the $2^n$ groups of first code stream blocks to obtain $2^n$ groups of code stream blocks. In other words, the $2^n$ groups of code stream blocks are obtained by converting the $2^n$ groups of first code stream blocks, and the $2^n$ groups of first code stream blocks are obtained by performing the first decoding on the target code block based on the type and the data unit of the target code block.

For example, the converting the $2^n$ groups of first code stream blocks to obtain $2^n$ groups of code stream blocks includes: converting a code stream block into an error code stream block, where the code stream block is obtained based on a bit group that is in the $2^n$ groups of first code stream blocks and that has a content sequence error or content error. For example, in the error code stream block, a control block is 0xFF and a data block is 0xFEFEFEFE. The target code block in which the error occurs is processed, so that a receive end can distinguish between error data and correct data, to ensure data reliability.

According to the decoding method provided in an embodiment of the application, the $2^n$ groups of code stream blocks including the control blocks and the data blocks are obtained by performing the first decoding on the target code block, without a need of transcoding the target code block to obtain $2^n$ 66-bit code blocks and decoding the $2^n$ 66-bit code blocks. Therefore, decoding efficiency is improved, and delay, power consumption, and chip area occupation caused by the decoding process are reduced.

The foregoing describes the encoding method provided in embodiments of this application. Corresponding to the foregoing method, embodiments of this application further provides an encoding apparatus. FIG. 21 is a schematic diagram of a structure of an encoding apparatus according to an embodiment of this application. The apparatus is used in a first network device, and the first network device is the first network device in the embodiment shown in FIG. 1. Based on the following plurality of modules shown in FIG. 21, the encoding apparatus shown in FIG. 21 can perform all or some operations performed by the first network device. It should be understood that the apparatus may include more additional modules than the shown modules, or some of the shown modules are omitted. This is not limited in an embodiment of the application. As shown in FIG. 21, the apparatus includes:

an obtaining module 2201, configured to obtain $2^n$ groups of code stream blocks, where any group of code stream blocks includes a control block and a data block, and n is an integer greater than 1; and a first encoding module 2202, configured to perform first encoding on the $2^n$ groups of code stream blocks to obtain a target code block, where the target code block includes a data unit and a type that is determined based on control blocks in the $2^n$ groups of code stream blocks, and the data unit is obtained by performing the first encoding on data blocks in the $2^n$ groups of code stream blocks in an encoding manner determined based on the control blocks and the data blocks in the $2^n$ groups of code stream blocks.

In an embodiment, the type indicates that the target code block is a data code block; and the data unit is obtained by performing the first encoding on the data blocks in the $2^n$ groups of code stream blocks based on a sequence of the $2^n$ groups of code stream blocks.

In an embodiment, the type indicates that the target code block is a control code block; and the data unit includes a code block identifier ID and code block content, where the code block content is obtained by performing the first encoding on the data blocks in the $2^n$ groups of code stream blocks based on a sequence determined based on the control blocks and the data blocks in the $2^n$ groups of code stream blocks, the code block ID is obtained based on the control blocks and the data blocks in the $2^n$ groups of code stream blocks, and the code block ID indicates a type of a data block in each group of code stream blocks and a location, in the code block content, of first-encoded content of each group of code stream blocks.

In an embodiment, the code block ID includes a first ID and a second ID, the first ID indicates the type of the data block in each group of code stream blocks, and the second ID indicates the location, in the code block content, of the first-encoded content of each group of code stream blocks.

In an embodiment, the code block ID includes m bits, and m is an integer greater than or equal to 4.

In an embodiment, the code block ID has Hamming distance protection.

In an embodiment, the target code block is an error code block, and the error code block includes error indication data.

In an embodiment, the target code block is obtained by processing the $2^n$ groups of code stream blocks based on an error detection result, and the error detection result is obtained based on the control blocks and the data blocks in the $2^n$ groups of code stream blocks.

In an embodiment, the error detection result includes a content sequence error or content error of the $2^n$ groups of code stream blocks, the target code block is obtained by performing the first encoding based on a code stream block that has a correct content sequence and correct content and an error block in the $2^n$ groups of code stream blocks, and the error block is obtained based on a code stream block that has a content sequence error or content error in the $2^n$ groups of code stream blocks.

In an embodiment, the control block includes t bits, the data block includes 8t bits, and t is a positive integer.

In an embodiment, a value of n is 2, a value of t is 8, and the target code block is 257 bits.

In an embodiment, all of the $2^n$ groups of code stream blocks are from a media independent interface MII.

In an embodiment, the apparatus further includes: a second encoding module 2203, configured to perform second encoding on the target code block based on a forward error correction FEC code type, to obtain first data; and a sending module 2204, configured to send the first data.

According to the encoding apparatus provided in an embodiment of the application, the target code block is obtained by performing the first encoding on the $2^n$ groups of code stream blocks including the control blocks and the data blocks, without a need of performing 64B/66B encoding on each group of the $2^n$ groups of code stream blocks to obtain $2^n$ 66-bit code blocks and transcoding the $2^n$ 66-bit code blocks. Therefore, encoding efficiency is improved, and delay, power consumption, and chip area occupation caused by the encoding process are reduced.

Figure 22:
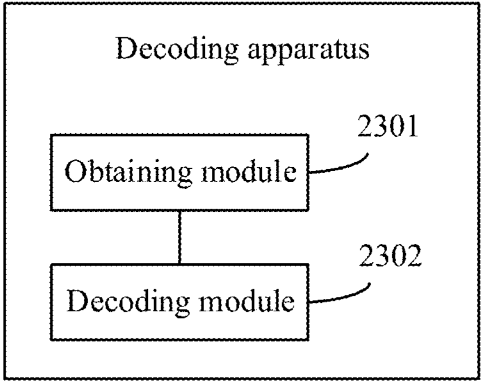
FIG. 22 is a schematic diagram of a structure of a decoding apparatus according to an embodiment of this application.

The foregoing describes the decoding method provided in embodiments of this application. Corresponding to the foregoing method, embodiments of this application further provide a decoding apparatus. FIG. 22 is a schematic diagram of a structure of a decoding apparatus according to an embodiment of this application. The apparatus may be used in a second network device, and the second network device is the second network device in the embodiment shown in FIG. 1. Based on the following plurality of modules shown in FIG. 22, the decoding apparatus shown in FIG. 22 can perform all or some operations performed by the second network device. It should be understood that the apparatus may include more additional modules than the shown modules, or some of the shown modules are omitted. This is not limited in an embodiment of the application. As shown in FIG. 22, the apparatus includes:

an obtaining module 2301, configured to obtain a target code block, where the target code block includes a type and a data unit; and a decoding module 2302, configured to perform first decoding on the target code block based on the type and the data unit of the target code block, to obtain $2^n$ groups of code stream blocks, where any group of code stream blocks includes a data block and a control block that is obtained based on the type and the data unit, the data block is obtained by performing the first decoding on the data unit in a decoding manner determined based on the type and the data unit, and n is an integer greater than 1.

In an embodiment, the type indicates that the target code block is a data code block; and a data block included in group i of code stream blocks in the $2^n$ groups of code stream blocks is obtained by performing the first decoding on content, in the data unit, that corresponds to group i of code stream blocks and that has a length of 8t, where t is a positive integer, and i is an integer greater than or equal to 1 and less than or equal to $2^n$, or i is an integer greater than or equal to 0 and less than or equal to $2^n$-1.

In an embodiment, the type indicates that the target code block is a control code block, the data unit includes a code block identifier ID and code block content, and the code block ID indicates a type of a data block in each group of code stream blocks and a location, in the code block content, of first-encoded content of each group of code stream blocks; and a control block included in group i of code stream blocks in the $2^n$ groups of code stream blocks is obtained based on the type and the code block ID, and a data block included in group i of code stream blocks in the $2^n$ groups of code stream blocks is obtained by performing the first decoding on the code block content in a decoding manner determined based on the type and the code block ID, where i is an integer greater than or equal to 1 and less than or equal to $2^n$, or i is an integer greater than or equal to 0 and less than or equal to $2^n$-1.

In an embodiment, the code block ID includes a first ID and a second ID, the first ID indicates the type of the data block in each group of code stream blocks, and the second ID indicates the location, in the code block content, of the first-encoded content of each group of code stream blocks; and the control block included in group i of code stream blocks is obtained based on the type, bits that are in the first ID and that correspond to group i of code stream blocks, and bits that are in the second ID and that correspond to group i of code stream blocks; and the data block included in group i of code stream blocks is obtained by performing the first decoding on the code block content in a decoding manner determined based on the type, the bits that are in the first ID and that correspond to group i of code stream blocks, and the bits that are in the second ID and that correspond to group i of code stream blocks.

In an embodiment, a type of the data block included in group i of code stream blocks is determined based on content of the control block included in group i of code stream blocks and content of the data block included in group i of code stream blocks.

In an embodiment, the code block ID includes m bits, and m is an integer greater than or equal to 4.

In an embodiment, the code block ID has Hamming distance protection.

In an embodiment, the data unit includes a code block identifier ID, and the type and the code block ID indicate that the target code block is an error code block; and a control block included in each group of the $2^n$ groups of code stream blocks is a first value, a data block included in each group of the $2^n$ groups of code stream blocks is a second value, and the first value and the second value indicate that the code stream block is an error code stream block.

In an embodiment, the obtaining module 2301 is configured to: receive second data, where the second data is obtained based on first data that is encoded by using a forward error correction FEC code type; and perform second decoding on the second data to obtain the target code block, where the second decoding is error correction processing.

In an embodiment, the target code block is an error code block obtained when error correction is performed on the second data but the error correction fails.

In an embodiment, the obtaining module 2301 is configured to: receive second data, where the second data is obtained based on first data that is encoded by using a forward error correction FEC code type; and perform second decoding on the second data to obtain the target code block, where the second decoding is error detection processing with error correction bypassed.

In an embodiment, the target code block is an error code block obtained when an error is detected from the second data but error correction is bypassed.

In an embodiment, the $2^n$ groups of code stream blocks are obtained by performing the first decoding on the target code block based on an error detection result and the type and the data unit of the target code block, and the error detection result is obtained based on the type and the data unit of the target code block.

In an embodiment, the error detection result includes a content sequence error or content error of the target code block, the $2^n$ groups of code stream blocks are obtained by performing the first decoding on a second code block based on a type and a data unit of the second code block, and the second code block is a code block that is obtained by converting the target code block and that has a same quantity of bits as the target code block.

In an embodiment, the error detection result includes a content sequence error or content error of the target code block, the $2^n$ groups of code stream blocks are obtained by converting $2^n$ groups of first code stream blocks, and the $2^n$ groups of first code stream blocks are obtained by performing the first decoding on the target code block based on the type and the data unit of the target code block.

In an embodiment, the control block includes t bits, the data block includes 8t bits, and t is a positive integer.

In an embodiment, a value of n is 2, a value of t is 8, and the target code block is 257 bits In an embodiment, all of the $2^n$ groups of code stream blocks are in a media independent interface MII format.

According to the decoding apparatus provided in an embodiment of the application, the $2^n$ groups of code stream blocks including the control blocks and the data blocks are obtained by decoding the target code block, without a need of transcoding the target code block to obtain $2^n$ 66-bit code blocks and decoding the $2^n$ 66-bit code blocks. Therefore, decoding efficiency is improved, and delay, power consumption, and chip area occupation caused by the decoding process are reduced.

It should be understood that, when the apparatuses provided in FIG. 21 and FIG. 22 implement functions of the apparatuses, division into the foregoing functional modules is merely used as an example for description. In actual applications, the foregoing functions may be allocated to different functional modules for implementation as required. In other words, an inner structure of a device is divided into different functional modules, to implement all or some of the functions described above. In addition, the apparatus provided in the foregoing embodiment and the method embodiments belong to a same concept. For an implementation process of the apparatus, refer to the method embodiments. Details are not described herein again.

Figure 23:
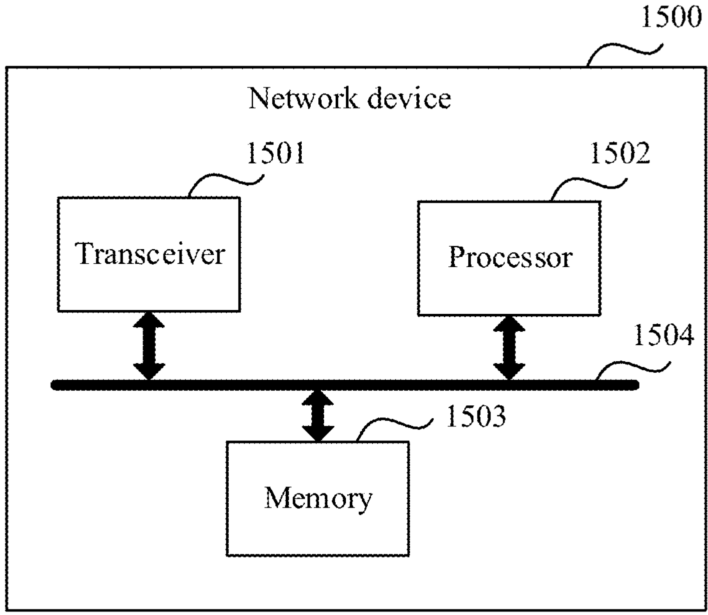
FIG. 23 is a schematic diagram of a structure of a network device according to an embodiment of this application.

For a hardware structure of the device in the foregoing embodiments, refer to a network device 1500 shown in FIG. 23. The network device 1500 includes a transceiver 1501, a processor 1502, and a memory 1503. The transceiver 1501, the processor 1502, and the memory 1503 are connected to each other through a bus 1504. The transceiver 1501 is configured to receive a packet and send a packet. The memory 1503 is configured to store instructions or program code. The processor 1502 is configured to invoke the instructions or the program code in the memory 1503, to enable the device to perform related processing operations of the first network device or the second network device in the foregoing method embodiments. In an embodiment, the network device 1500 in an embodiment of the application may correspond to the first network device or the second network device in each of the foregoing method embodiments. The processor 1502 in the network device 1500 reads the instructions or program code in the memory 1503, to enable the network device 1500 shown in FIG. 23 to perform all or some of operations performed by the first network device or the second network device.

The network device 1500 may further correspond to the apparatuses shown in FIG. 21 and FIG. 22. For example, the obtaining module 2201 and the obtaining module 2301 in FIG. 21 and FIG. 22 are equivalent to the transceiver 1501, and the first encoding module 2202 and the decoding module 2302 are equivalent to the processor 1502.

Figure 24:
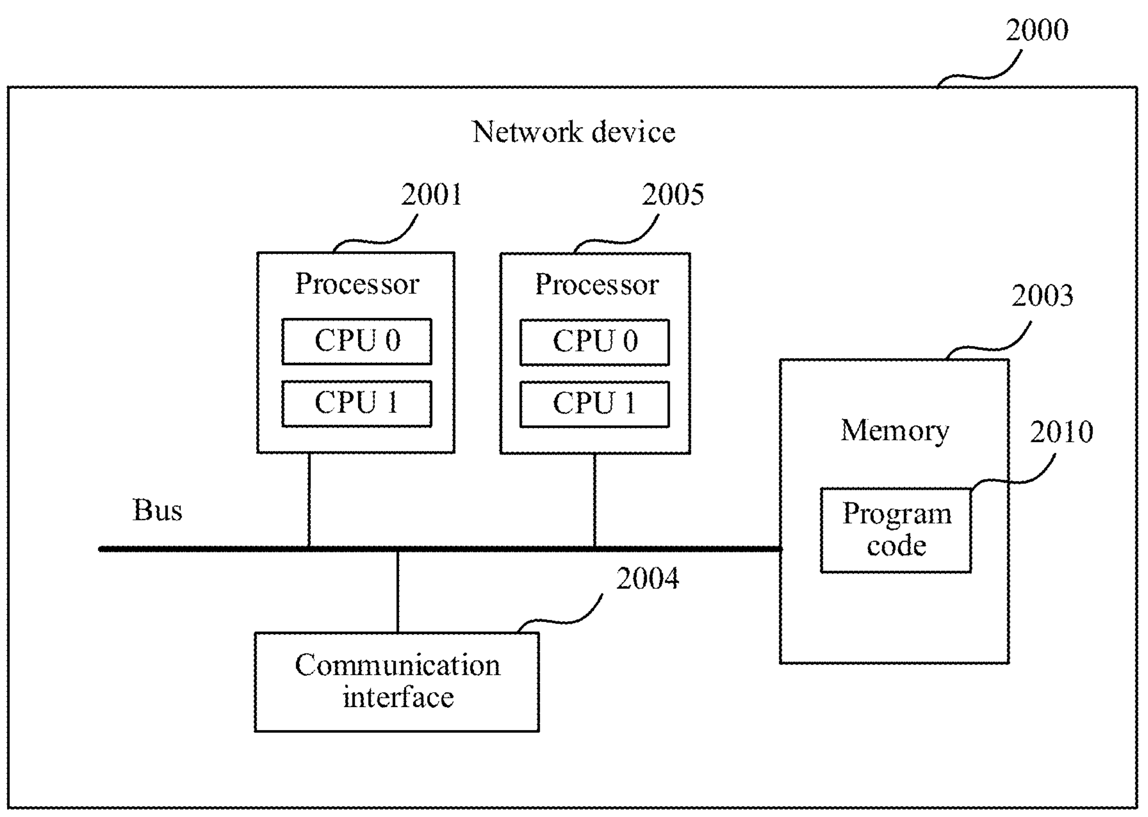
FIG. 24 is a schematic diagram of a structure of another network device according to an embodiment of this application.

FIG. 24 is a schematic diagram of a structure of a network device 2000 provided in an example embodiment of this application. The network device 2000 shown in FIG. 24 is configured to perform operations related to the encoding method shown in FIG. 2 and operations related to the decoding method shown in FIG. 19. The network device 2000 is, for example, a switch or a router.

As shown in FIG. 24, the network device 2000 includes at least one processor 2001, a memory 2003, and at least one communication interface 2004.

The processor 2001 is, for example, a general-purpose central processing unit (CPU), a digital signal processor (DSP), a network processor (NP), a graphics processing unit (GPU), a neural network processing unit (NPU), a data processing unit (DPU), a microprocessor, or one or more integrated circuits configured to implement the solutions of this application. For example, the processor 2001 includes an application-specific integrated circuit (ASIC), a programmable logic device (PLD) or another programmable logic device, a transistor logic device, a hardware component, or any combination thereof. The PLD is, for example, a complex programmable logic device (CPLD), a field programmable gate array (FPGA), a generic array logic (GAL), or any combination thereof. The processor may implement or execute various logical blocks, modules, and circuits described with reference to the content disclosed in embodiments of the present disclosure. The processor may alternatively be a combination of processors implementing a computing function, for example, a combination of one or more microprocessors, or a combination of a DSP and a microprocessor.

In an embodiment, the network device 2000 further includes a bus. The bus is configured to transmit information between the components of the network device 2000. The bus may be a peripheral component interconnect (PCI) bus, an extended industry standard architecture (EISA) bus, or the like. Buses may be classified into an address bus, a data bus, a control bus, and the like. For ease of representation, only one thick line is used to represent the bus in FIG. 24, but this does not mean that there is only one bus or only one type of bus. In addition to being connected through the bus, the components of the network device 2000 in FIG. 24 may be connected in another manner. A manner in which the components are connected is not limited in an embodiment of the present disclosure.

The memory 2003 is, for example, a read-only memory (ROM) or another type of static storage device that can store static information and instructions, or a random access memory (RAM) or another type of dynamic storage device that can store information and instructions, or an electrically erasable programmable read-only memory (EEPROM), a compact disc read-only memory (CD-ROM) or another compact disc storage, an optical disc storage (including a compact disc, a laser disc, an optical disc, a digital versatile disc, a Blu-ray disc, and the like), a magnetic disk storage medium or another magnetic storage device, or any other medium that can be used for carrying or storing expected program code in a form of instructions or a data structure and that can be accessed by a computer, but is not limited thereto. For example, the memory 2003 exists independently, and is connected to the processor 2001 through the bus. Alternatively, the memory 2003 and the processor 2001 may be integrated together.

The communication interface 2004 uses any apparatus such as a transceiver, and is configured to communicate with another device or a communication network. The communication network may be an ethernet, a radio access network (RAN), a wireless local area network (WLAN), or the like. The communication interface 2004 may include a wired communication interface, and may further include a wireless communication interface. In an embodiment, the communication interface 2004 may be an ethernet interface, a fast ethernet (FE) interface, a gigabit ethernet (GE) interface, an asynchronous transfer mode (ATM) interface, a wireless local area network (WLAN) interface, a cellular network communication interface, or a combination thereof. The ethernet interface may be an optical interface, an electrical interface, or a combination thereof. In an embodiment of the application, the communication interface 2004 may be used by the network device 2000 to communicate with another device.

In an embodiment, the processor 2001 may include one or more CPUs, for example, a CPU 0 and a CPU 1 shown in FIG. 24. Each of the processors may be a single-core (single-CPU) processor, or may be a multi-core (multi-CPU) processor. The processor herein may be one or more devices, circuits, and/or processing cores configured to process data (for example, computer program instructions).

In an embodiment, the network device 2000 may include a plurality of processors, such as the processor 2001 and a processor 2005 in FIG. 24. Each of the processors may be a single-core (single-CPU) processor, or may be a multi-core (multi-CPU) processor. The processor herein may be one or more devices, circuits, and/or processing cores configured to process data (for example, computer program instructions).

In an embodiment, the network device 2000 may further include an output device and an input device. The output device communicates with the processor 2001, and may display information in a plurality of manners. For example, the output device may be a liquid crystal display (LCD), a light emitting diode (LED) display device, a cathode ray tube (CRT) display device, or a projector. The input device communicates with the processor 2001, and may receive an input from a user in a plurality of manners. For example, the input device may be a mouse, a keyboard, a touchscreen device, or a sensing device.

In some embodiments, the memory 2003 is configured to store program code 2010 for executing the solutions of this application, and the processor 2001 may execute the program code 2010 stored in the memory 2003. In other words, the network device 2000 may implement the encoding method or the decoding method provided in the method embodiments by using the processor 2001 and the program code 2010 in the memory 2003. The program code 2010 may include one or more software modules. In an embodiment, the processor 2001 may alternatively store program code or instructions for performing the solutions of this application.

In an embodiment, the network device 2000 in an embodiment of the application may correspond to the first network device or the second network device in each of the foregoing method embodiments. The processor 2001 in the network device 2000 reads the program code 2010 in the memory 2003 or the program code or instructions stored in the processor 2001, to enable the network device 2000 shown in FIG. 24 to perform all or some of operations performed by the first network device or the second network device.

The network device 2000 may further correspond to the apparatuses shown in FIG. 21 and FIG. 22. Each function module in the apparatuses shown in FIG. 21 and FIG. 22 is implemented by using software of the network device 2000. In other words, the functional modules included in the apparatuses shown in FIG. 21 and FIG. 22 are generated after the processor 2001 in the network device 2000 reads the program code 2010 stored in the memory 2003. For example, the obtaining module 2201 and the obtaining module 2301 in FIG. 21 and FIG. 22 are equivalent to the communication interface 2004, and the first encoding module 2202 and the decoding module 2302 are equivalent to the processor 2001 and/or the processor 2005.

The operations of the method shown in FIG. 2 and FIG. 19 are completed by using an integrated logic circuit of hardware in the processor of the network device 2000 or instructions in a form of software. The operations of the method disclosed with reference to embodiments of this application may be directly performed by a hardware processor, or may be performed by a combination of hardware in the processor and a software module. A software module may be located in a mature storage medium in the art, such as a random access memory, a flash memory, a read-only memory, a programmable read-only memory, an electrically erasable programmable memory, or a register. The storage medium is located in the memory. The processor reads information in the memory, and completes the operations of the foregoing methods in combination with hardware of the processor. To avoid repetition, details are not described herein again.

Figure 25:
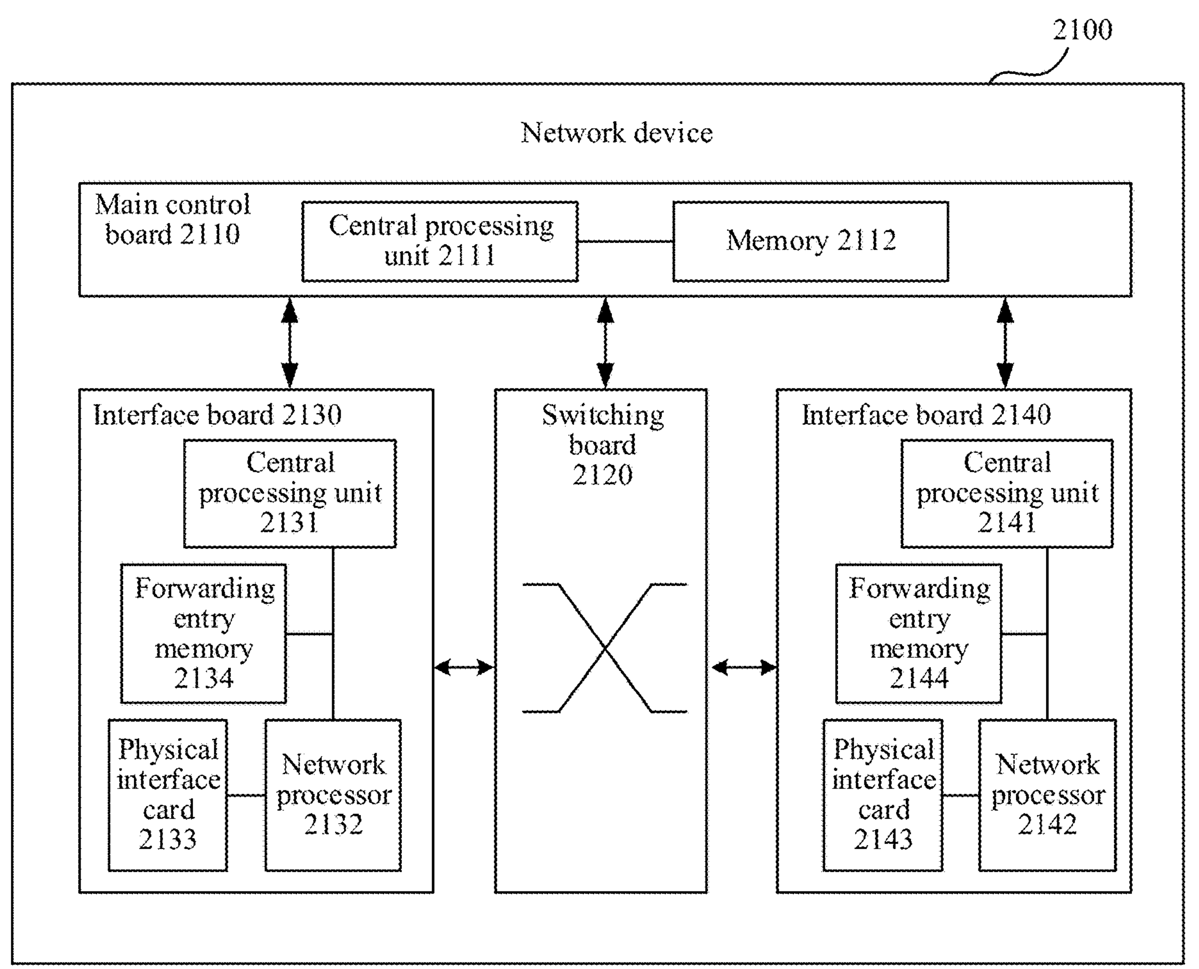
FIG. 25 is a schematic diagram of a structure of another network device according to an embodiment of this application.

FIG. 25 is a schematic diagram of a structure of a network device 2100 provided in another example embodiment of this application. The network device 2100 shown in FIG. 25 is configured to perform all or some of the operations in the method shown in FIG. 2 and FIG. 19. The network device 2100 is, for example, a switch or a router. The network device 2100 may be implemented by a generic bus architecture.

As shown in FIG. 25, the network device 2100 includes a main control board 2110 and an interface board 2130.

The main control board is also referred to as a main processing unit (MPU) or a route processor card. The main control board 2110 is configured to control and manage components in the network device 2100, including route computation, device management, device maintenance, and protocol processing functions. The main control board 2110 includes a central processing unit 2111 and a memory 2112.

The interface board 2130 is also referred to as a line interface unit card (LPU), a line card, or a service board. The interface board 2130 is configured to: provide various service interfaces and implement data packet forwarding. The service interfaces include but are not limited to an ethernet interface, a POS (packet over SONET/SDH) interface, and the like. The ethernet interface is, for example, a flexible ethernet service interface (FlexE Clients). The interface board 2130 includes: a central processing unit 2131, a network processor 2132, a forwarding entry memory 2134, and a physical interface card (PIC) 2133.

The central processing unit 2131 on the interface board 2130 is configured to: control and manage the interface board 2130 and communicate with the central processing unit 2111 on the main control board 2110.

The network processor 2132 is configured to implement packet sending processing. A form of the network processor 2132 may be a forwarding chip. The forwarding chip may be a network processor (NP). In some embodiments, the forwarding chip may be implemented by using an application-specific integrated circuit (ASIC) or a field programmable gate array (FPGA). In an embodiment, the network processor 2132 is configured to forward a received packet based on a forwarding table stored in the forwarding entry memory 2134. If a destination address of the packet is an address of the network device 2100, the network processor 2132 sends the packet to a CPU (for example, the central processing unit 2131) for processing. If a destination address of the packet is not an address of the network device 2100, the network processor 2132 finds, from the forwarding table based on the destination address, a next hop and an egress interface that correspond to the destination address, and forwards the packet to the egress interface corresponding to the destination address. Processing an uplink packet may include: processing an inbound interface of the packet and searching a forwarding table. Processing a downlink packet may include: searching a forwarding table, and the like. In some embodiments, the central processing unit may also perform a function of a forwarding chip, for example, implement software forwarding based on a general-purpose CPU, so that no forwarding chip is needed in the interface board.

The physical interface card 2133 is configured to implement a physical layer interconnection function, so that original traffic enters the interface board 2130, and a processed packet is sent out from the physical interface card 2133. The physical interface card 2133 is also referred to as a subcard, may be installed on the interface board 2130, and is responsible for converting an optical/electrical signal into a packet, performing validity check on the packet, and then forwarding the packet to the network processor 2132 for processing. In some embodiments, the central processing unit 2131 may also perform a function of the network processor 2132, for example, implement software forwarding based on a general-purpose CPU. Therefore, the network processor 2132 is not needed in the physical interface card 2133.

In an embodiment, the network device 2100 includes a plurality of interface boards. For example, the network device 2100 further includes an interface board 2140. The interface board 2140 includes a central processing unit 2141, a network processor 2142, a forwarding entry memory 2144, and a physical interface card 2143. Functions and implementations of components in the interface board 2140 are the same as or similar to those of the interface board 2130, and details are not described herein again.

In an embodiment, the network device 2100 further includes a switching board 2120. The switching board 2120 may also be referred to as a switch fabric unit (SFU). When the network device has a plurality of interface boards, the switching board 2120 is configured to perform data exchange between the interface boards. For example, the interface board 2130 and the interface board 2140 may communicate with each other by using the switching board 2120.

The main control board 2110 is coupled to the interface board. For example, the main control board 2110, the interface board 2130, the interface board 2140, and the switching board 2120 are connected to a system backboard by using a system bus for interworking. In an embodiment, an inter-process communication (IPC) protocol channel is established between the main control board 2110, the interface board 2130, and the interface board 2140. The main control board 2110 communicates with the interface board 2130 and the interface board 2140 through the IPC channel.

Logically, the network device 2100 includes a control plane and a forwarding plane. The control plane includes a main control board 2110 and a central processing unit 2111. The forwarding plane includes components that perform forwarding, for example, a forwarding entry memory 2134, a physical interface card 2133, and a network processor 2132. The control plane performs functions such as a router, generating a forwarding table, processing signaling and protocol packets, and configuring and maintaining a state of the network device. The control plane delivers the generated forwarding table to the forwarding plane. On the forwarding plane, the network processor 2132 searches, based on the forwarding table delivered by the control plane, a table for forwarding the packet received by the physical interface card 2133. The forwarding table delivered by the control plane may be stored in the forwarding entry memory 2134. In some embodiments, the control plane and the forwarding plane may be completely separated, and are not on a same network device.

It should be noted that there may be one or more main control boards, and when there are a plurality of main control boards, a primary main control board and a secondary main control board may be included. There may be one or more interface boards. A network device with a stronger data processing capability provides a larger quantity of interface boards. There may also be one or more physical interface cards on the interface board. There may be no switching board or one or more switching boards. When there are a plurality of switching boards, load balancing and redundancy backup may be implemented together. In a centralized forwarding architecture, a network device may not need a switching board, and an interface board performs a function of processing service data of an entire system. In a distributed forwarding architecture, a network device may have at least one switching board, and implements data exchange between a plurality of interface boards by using the switching board, to provide a large-capacity data exchange and processing capability. Therefore, a data access and processing capability of a network device in a distributed architecture is greater than that of a network device in a centralized architecture. In an embodiment, the form of the network device may alternatively be a single board. That is, there is no switch fabric board, and functions of the interface board and the main control board are integrated into the board. In this case, the central processing unit on the interface board and the central processing unit on the main control board may be combined into one central processing unit on the board. The one central processing unit on the board performs functions of the two central processing units existing after the two central processing units are combined. The network device in this form has low data exchange and processing capabilities (for example, a network device such as a low-end switch or router). An architecture that is to be used depends on a networking deployment scenario. This is not limited herein.

In an embodiment, the network device 2100 corresponds to the apparatuses shown in FIG. 21 and FIG. 22. In some embodiments, the obtaining module 2201 and the obtaining module 2301 in the apparatuses shown in FIG. 21 and FIG. 22 are equivalent to a physical interface card 2133 or a physical interface card 2143 in the network device 2100. The first encoding module 2202 and the decoding module 2302 in the apparatuses shown in FIG. 21 and FIG. 22 are equivalent to at least one of the central processing unit 2111, the network processor 2132, and the network processor 2142 in the network device 2100.

Based on the network devices shown in FIG. 23, FIG. 24, and FIG. 25, an embodiment of this application further provides a communication system. The system includes a first network device and a second network device. In an embodiment, the first network device is the network device 1500 shown in FIG. 23, the network device 2000 shown in FIG. 24, or the network device 2100 shown in FIG. 25, and the second network device is the network device 1500 shown in FIG. 23, the network device 2000 shown in FIG. 24, or the network device 2100 shown in FIG. 25.

For methods performed by the first network device and the second network device, refer to related descriptions of the embodiments shown in FIG. 1, FIG. 2, and FIG. 19. Details are not described herein again.

It should be understood that the processor may be a central processing unit (CPU), or may be another general-purpose processor, a digital signal processor (DSP), an application specific integrated circuit (ASIC), a field-programmable gate array (FPGA) or another programmable logic device, a discrete gate or a transistor logic device, a discrete hardware component, or the like. The general-purpose processor may be a microprocessor, any conventional processor, or the like. It should be noted that the processor may be a processor that supports an advanced reduced instruction set computing machines (ARM) architecture.

Further, in an optional embodiment, the memory may include a read-only memory and a random access memory, and provide instructions and data for the processor. The memory may further include a nonvolatile random access memory. For example, the memory may further store information of a device type.

The memory may be a volatile memory or a non-volatile memory, or may include both a volatile memory and a non-volatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM) that is used as an external cache. By way of example, and not limitation, many forms of RAMs are available, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM).

A computer-readable storage medium is further provided. The storage medium stores at least one program instruction or code. When the program instruction or the code is loaded and executed by a processor, a computer is enabled to implement the encoding method in FIG. 2 or the decoding method in FIG. 19.

This application provides a computer program (product). When the computer program is executed by a computer, a processor or the computer is enabled to perform corresponding operations and/or procedures in the foregoing method embodiments.

A chip is provided. The chip includes a processor. The chip is configured to invoke, from a memory, and run instructions stored in the memory, to enable a communication device on which the chip is installed to perform the methods in the foregoing aspects.

Another chip is provided. The chip includes an input interface, an output interface, a processor, and a memory. The input interface, the output interface, the processor, and the memory are connected through an internal connection path. The processor is configured to execute code in the memory. When the code is executed, the processor is configured to perform the methods in the foregoing aspects.

A device is further provided. The device includes the foregoing chip. In an embodiment, the device is a network device. For example, the device is a router, a switch, or a server.

All or some of the foregoing embodiments may be implemented by using software, hardware, firmware, or any combination thereof. When software is used to implement the embodiments, all or a part of the embodiments may be implemented in a form of a computer program product. The computer program product includes one or more computer instructions. When the computer program instructions are loaded and executed on the computer, the procedure or functions according to an embodiment of the application are all or partially generated. The computer may be a general-purpose computer, a special-purpose computer, a computer network, or another programmable apparatus. The computer instructions may be stored in a computer-readable storage medium, or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

In an embodiment, the objectives, technical solutions, and beneficial effects of this application are further described in detail. It should be understood that the foregoing descriptions are merely implementations of this application, but are not intended to limit the protection scope of this application. Any modification, equivalent replacement, improvement, or the like made based on the technical solutions of this application shall fall within the protection scope of this application.

One of ordinary skilled in the art may be aware that, with reference to the method operations and modules described in embodiments disclosed in this specification, the method operations and modules can be implemented by using software, hardware, firmware, or any combination thereof. To clearly describe interchangeability between the hardware and the software, the operations and compositions of embodiments have been generally described in terms of functions in the foregoing descriptions. Whether the functions are performed by the hardware or the software depends on particular applications and design constraints of the technical solutions. One of ordinary skilled in the art may use different methods to implement the described functions for each particular application, but it should not be considered that the implementation goes beyond the scope of this application.

One of ordinary skilled in the art may understand that all or some of the operations of embodiments may be implemented by hardware or a program instructing related hardware. The program may be stored in a computer-readable storage medium. The storage medium may include: a read-only memory, a magnetic disk, or an optical disc.

When software is used to implement the embodiments, all or a part of the embodiments may be implemented in a form of a computer program product. The computer program product includes one or more computer program instructions. In an example, the method according to embodiments of this application may be described in the context of machine-executable instructions. For example, the machine-executable instructions are included in a program module that is in a component for execution on a real or virtual processor of a target. Generally, the program module includes a routine, a program, a library, an object, a class, a component, a data structure, and the like, and executes a task or implements an abstract data structure. In various embodiments, the functions of the program modules may be combined or split between the described program modules. The machine-executable instructions for the program module may be executed locally or within a distributed device. In the distributed device, the program module may be located in both a local storage medium and a remote storage medium.

Computer program code for implementing the method in embodiments of this application may be written in one or more programming languages. The computer program code may be provided for a processor of a general-purpose computer, a dedicated computer, or another programmable data processing apparatus, so that when the program code is executed by the computer or the another programmable data processing apparatus, functions/operations specified in the flowcharts and/or block diagrams are implemented. The program code may be executed entirely on a computer, partly on a computer, as a standalone software package, partly on a computer and partly on a remote computer, or entirely on a remote computer or a server.

In the context of embodiments of this application, computer program code or related data may be carried in any appropriate carrier, so that the device, the apparatus, or the processor can perform various types of processing and operations described above. Examples of the carrier include a signal, a computer-readable medium, and the like.

Examples of the signal may include an electrical signal, an optical signal, a radio signal, a voice signal, or other forms of propagated signals, such as a carrier wave and an infrared signal.

A machine-readable medium may be any tangible medium that includes or stores programs for or with respect to an instruction execution system, apparatus, or device. The machine-readable medium may be a machine-readable signal medium or a machine-readable storage medium. The machine-readable medium may include but is not limited to an electronic, magnetic, optical, electromagnetic, infrared, or semiconductor system, apparatus, or device, or any appropriate combination thereof. A more detailed example of the machine-readable storage medium includes an electrical connection with one or more wires, a portable computer disk, a hard disk, a random access memory (RAM), a read-only memory (ROM), an erasable programmable read-only memory (EPROM or flash memory), an optical storage device, a magnetic storage device, or any appropriate combination thereof.

It may be clearly understood by one of ordinary skilled in the art that, for the purpose of convenient and brief description, for a detailed working process of the foregoing system, device, and module, refer to a corresponding process in the foregoing method embodiments. Details are not described herein again.

In the several embodiments provided in this application, it should be understood that the disclosed system, device, and method may be implemented in other manners. For example, the described device embodiment is merely an example. For example, division into modules is merely division into logical functions and there may be other division modes during actual application. For example, a plurality of modules or components may be combined or may be integrated to another system, or some characteristics may be ignored or not executed. In addition, the displayed or discussed mutual couplings or direct couplings or communication connections may be indirect couplings or communication connections implemented through some interfaces, devices, or modules, or may be electrical, mechanical, or other forms of connections.

The modules described as separate components may or may not be physically separate, and components displayed as modules may or may not be physical modules, for example, may be located at one position, or may be distributed on a plurality of network modules. Some or all of the modules may be selected based on actual requirements to implement the objectives of the solutions of embodiments of this application.

In addition, functional modules in embodiments of this application may be integrated into one processing module, or each of the modules may exist alone physically, or two or more modules may be integrated into one module. The integrated module may be implemented in a form of hardware, or may be implemented in a form of a software functional module.

If the integrated module is implemented in the form of the software functional module and sold or used as an independent product, the integrated module may be stored in a computer-readable storage medium. Based on this understanding, the technical solutions of this application essentially, or the part contributing to the conventional technology, or all or some of the technical solutions may be implemented in a form of a software product. The computer software product is stored in a storage medium, and includes several instructions for instructing a computer device (which may be a personal computer, a server, or a network device) to perform all or some of the operations of the method described in embodiments of this application. The foregoing storage medium includes any medium that can store program code, such as a USB flash drive, a removable hard disk, a read-only memory (ROM), a random access memory (RAM), a magnetic disk, or an optical disc.

In this application, terms such as "first" and "second" are used to distinguish between same items or similar items that have basically same functions. It should be understood that "first", "second", and "$n^{th}$" do not have a logical or time sequential dependency relationship, and do not limit the quantity and execution sequence. It should further be understood that although the following description uses terms such as "first" and "second" to describe various elements, these elements should not be limited by the terms. These terms are simply used to distinguish one element from another element. For example, without departing from the scope of various examples, a first network device may be referred to as a second network device, and similarly, a second network device may be referred to as a first network device. Both the first network device and the second network device may be any type of network devices, and in some cases, may be separate and different network devices.

It should further be understood that, in embodiments of this application, sequence numbers of the processes do not mean execution sequences. The execution sequences of the processes should be determined based on functions and internal logic of the processes, and should not be construed as any limitation on implementation processes of embodiments of this application.

In this application, the term "at least one" means one or more, and the term "a plurality of" in this application means two or more. For example, a plurality of second packets means two or more second packets. The terms "system" and "network" are often used interchangeably in this specification.

It should be understood that the terms used in the descriptions of the various examples in this specification are merely intended to describe examples and are not intended to impose a limitation. As used in the descriptions of the various examples and in the appended claims, singular forms "one ("a" or "an")" and "the" are intended to also include a plural form, unless otherwise explicitly indicated in the context.

It should further be understood that the term "include" (also referred to as "includes", "including", "comprises", and/or "comprising") used in this specification specifies presence of the stated features, integers, steps, operations, elements, and/or components, with presence or addition of one or more other features, integers, steps, operations, elements, components, and/or their components not excluded.

It should be further understood that the term "if" may be interpreted as a meaning of "when" ("when" or "upon"), "in response to determining", or "in response to detecting". Similarly, based on the context, the phrase "if it is determined that" or "if (a stated condition or event) is detected" may be interpreted as a meaning of "when it is determined that" or "in response to determining" or "when (a stated condition or event) is detected" or "in response to detecting (a stated condition or event)".

It should be understood that determining B based on A does not mean that B is determined based only on A, and B may alternatively be determined based on A and/or other information.

It should further be understood that "one embodiment", "an embodiment", and "a possible implementation" mentioned throughout the specification mean that a feature, structure, or characteristic related to the embodiment or an implementation is included in at least one embodiment of this application. Therefore, "in one embodiment" or "in an embodiment" or "a possible implementation" appearing throughout the specification may not necessarily refer to a same embodiment. In addition, these particular features, structures, or characteristics may be combined in one or more embodiments by using any appropriate manner.

The invention claimed is:

1. A method for encoding, comprising:

obtaining $2^n$ groups of code stream blocks, wherein any group of code stream blocks comprises a control block and a data block, and n is an integer greater than 1; and performing first encoding on the $2^n$ groups of code stream blocks to obtain a target code block comprising a data unit and a type determined based on control blocks in the $2^n$ groups of code stream blocks, wherein the data unit is obtained by performing the first encoding on data blocks in the $2^n$ groups of code stream blocks in an encoding manner determined based on the control blocks and the data blocks in the $2^n$ groups of code stream blocks.

2. The method according to claim 1, wherein the type indicates that the target code block is a data code block; and the data unit is obtained by performing the first encoding on the data blocks in the $2^n$ groups of code stream blocks based on a sequence of the $2^n$ groups of code stream blocks.

3. The method according to claim 1, wherein the type indicates that the target code block is a control code block; and the data unit comprises a code block identifier (ID) and code block content obtained by performing the first encoding on the data blocks in the $2^n$ groups of code stream blocks based on a sequence determined based on the control blocks and the data blocks in the $2^n$ groups of code stream blocks, the code block ID is obtained based on the control blocks and the data blocks in the $2^n$ groups of code stream blocks, and the code block ID indicates a type of a data block in each group of code stream blocks and a location, in the code block content, of first-encoded content of each group of code stream blocks.

4. The method according to claim 3, wherein the code block ID comprises a first ID and a second ID, the first ID indicates the type of the data block in each group of code stream blocks, and the second ID indicates the location, in the code block content, of the first-encoded content of each group of code stream blocks.

5. The method according to claim 3, wherein the code block ID comprises m bits, and m is an integer greater than or equal to 4.

6. The method according to claim 3, wherein the code block ID has Hamming distance protection.

7. An apparatus for encoding, comprising:

a processor, and a memory coupled to the processor to store instructions, which when executed by the processor, cause the processor to:

obtain $2^n$ groups of code stream blocks, wherein any group of code stream blocks comprises a control block and a data block, and n is an integer greater than 1; and perform first encoding on the $2^n$ groups of code stream blocks to obtain a target code block comprising a data unit and a type determined based on control blocks in the $2^n$ groups of code stream blocks, wherein the data unit is obtained by performing the first encoding on data blocks in the $2^n$ groups of code stream blocks in an encoding manner determined based on the control blocks and the data blocks in the $2^n$ groups of code stream blocks.

8. The apparatus according to claim 7, wherein the type indicates that the target code block is a data code block; and the data unit is obtained by performing the first encoding on the data blocks in the $2^n$ groups of code stream blocks based on a sequence of the $2^n$ groups of code stream blocks.

9. The apparatus according to claim 7, wherein the type indicates that the target code block is a control code block; and the data unit comprises a code block identifier (ID) and code block content obtained by performing the first encoding on the data blocks in the $2^n$ groups of code stream blocks based on a sequence determined based on the control blocks and the data blocks in the $2^n$ groups of code stream blocks, the code block ID is obtained based on the control blocks and the data blocks in the $2^n$ groups of code stream blocks, and the code block ID indicates a type of a data block in each group of code stream blocks and a location, in the code block content, of first-encoded content of each group of code stream blocks.

10. The apparatus according to claim 9, wherein the code block ID comprises a first ID and a second ID, the first ID indicates the type of the data block in each group of code stream blocks, and the second ID indicates the location, in the code block content, of the first-encoded content of each group of code stream blocks.

11. The apparatus according to claim 9, wherein the code block ID comprises m bits, and m is an integer greater than or equal to 4.

12. The apparatus according to claim 9, wherein the code block ID has Hamming distance protection.

13. The apparatus according to claim 9, wherein the target code block is an error code block, and the error code block comprises error indication data.

14. An apparatus for decoding, wherein the apparatus comprises:

a processor, and a memory coupled to the processor to store instructions, which when executed by the processor, cause the processor to:

obtain a target code block, wherein the target code block comprises a type and a data unit; and perform first decoding on the target code block based on the type and the data unit of the target code block, to obtain $2^n$ groups of code stream blocks, wherein any group of code stream blocks comprises a data block and a control block obtained based on the type and the data unit, the data block is obtained by performing the first decoding on the data unit in a decoding manner determined based on the type and the data unit, and n is an integer greater than 1.

15. The apparatus according to claim 14, wherein the type indicates that the target code block is a data code block; and a data block comprised in group i of code stream blocks in the $2^n$ groups of code stream blocks is obtained by performing the first decoding on content, in the data unit, that corresponds to group i of code stream blocks and that has a length of 8t, wherein t is a positive integer, and i is an integer greater than or equal to 1 and less than or equal to $2^n$, or i is an integer greater than or equal to 0 and less than or equal to $2^n$-1.

16. The apparatus according to claim 14, wherein the type indicates that the target code block is a control code block, the data unit comprises a code block identifier (ID) and code block content, and the code block ID indicates a type of a data block in each group of code stream blocks and a location, in the code block content, of first-encoded content of each group of code stream blocks; and a control block comprised in group i of code stream blocks in the $2^n$ groups of code stream blocks is obtained based on the type and the code block ID, and a data block comprised in group i of code stream blocks in the $2^n$ groups of code stream blocks is obtained by performing the first decoding on the code block content in a decoding manner determined based on the type and the code block ID, wherein i is an integer greater than or equal to 1 and less than or equal to $2^n$, or i is an integer greater than or equal to 0 and less than or equal to $2^n$-1.

17. The apparatus according to claim 16, wherein the code block ID comprises a first ID and a second ID, the first ID indicates the type of the data block in each group of code stream blocks, and the second ID indicates the location, in the code block content, of the first-encoded content of each group of code stream blocks; and the control block comprised in group i of code stream blocks is obtained based on the type, bits that are in the first ID and that correspond to group i of code stream blocks, and bits that are in the second ID and that correspond to group i of code stream blocks; and the data block comprised in group i of code stream blocks is obtained by performing the first decoding on the code block content in a decoding manner determined based on the type, the bits that are in the first ID and that correspond to group i of code stream blocks, and the bits that are in the second ID and that correspond to group i of code stream blocks.

18. The apparatus according to claim 16, wherein a type of the data block comprised in group i of code stream blocks is determined based on content of the control block comprised in group i of code stream blocks and content of the data block comprised in group i of code stream blocks.

19. The apparatus according to claim 16, wherein the code block ID comprises m bits, and m is an integer greater than or equal to 4.

20. The apparatus according to claim 16, wherein the code block ID has Hamming distance protection.

* * * * *